(12) United States Patent
Hwang et al.

(10) Patent No.: US 12,191,236 B2
(45) Date of Patent: Jan. 7, 2025

(54) SEMICONDUCTOR PACKAGE

(71) Applicant: Samsung Electronics Co., Ltd., Suwon-si (KR)

(72) Inventors: Hyeonjeong Hwang, Cheonan-si (KR); Minjung Kim, Cheonan-si (KR); Dongkyu Kim, Anyang-si (KR); Taewon Yoo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 444 days.

(21) Appl. No.: 17/533,606

(22) Filed: Nov. 23, 2021

(65) Prior Publication Data

US 2022/0375829 A1 Nov. 24, 2022

(30) Foreign Application Priority Data

May 21, 2021 (KR) .................. 10-2021-0065607

(51) Int. Cl.
| | | |
|---|---|---|
| H01L 23/495 | (2006.01) | |
| H01L 23/31 | (2006.01) | |
| H01L 23/49 | (2006.01) | |
| H01L 23/498 | (2006.01) | |
| H01L 23/00 | (2006.01) | |
| H01L 25/18 | (2023.01) | |

(52) U.S. Cl.
CPC .......... *H01L 23/49* (2013.01); *H01L 23/3107* (2013.01); *H01L 23/49816* (2013.01); *H01L 23/49833* (2013.01); *H01L 24/73* (2013.01); *H01L 25/18* (2013.01); *H01L 2224/73204* (2013.01)

(58) Field of Classification Search
CPC .............................. H01L 23/49; H01L 24/16; H01L 2224/73204
USPC ................................................. 257/737, 772
See application file for complete search history.

(56) References Cited

U.S. PATENT DOCUMENTS

| | | | |
|---|---|---|---|
| 5,251,806 A | * | 10/1993 | Agarwala ............... H01L 24/12 |
| | | | 257/E21.511 |
| 5,607,877 A | * | 3/1997 | Matsuda ................. H01L 24/11 |
| | | | 257/E23.021 |

(Continued)

FOREIGN PATENT DOCUMENTS

KR      10-2196397 B1   12/2020

*Primary Examiner* — Nitin Parekh
(74) *Attorney, Agent, or Firm* — Harness, Dickey & Pierce, P.L.C.

(57) ABSTRACT

Disclosed is a semiconductor package comprising a first redistribution substrate; a solder ball on a bottom surface of the first redistribution substrate; a second redistribution substrate; a semiconductor chip between a top surface of the first redistribution substrate and a bottom surface of the second redistribution substrate; a conductive structure electrically connecting the first redistribution substrate and the second redistribution substrate, the conductive structure laterally spaced apart from the semiconductor chip and including a first conductive structure and a second conductive structure in direct contact with a top surface of the first conductive structure; and a conductive seed pattern between the first redistribution substrate and the first conductive structure. A material of first conductive structure and a material of the second conductive structure may be different from a material of the solder ball.

20 Claims, 24 Drawing Sheets

(56) References Cited

U.S. PATENT DOCUMENTS

| | | | | |
|---|---|---|---|---|
| 5,796,591 | A * | 8/1998 | Dalal | H01L 24/13 |
| | | | | 361/779 |
| 7,879,455 | B2 * | 2/2011 | Kajiwara | H01L 24/81 |
| | | | | 257/772 |
| 8,304,900 | B2 | 11/2012 | Jang et al. | |
| 8,536,462 | B1 * | 9/2013 | Darveaux | H01L 23/49811 |
| | | | | 174/262 |
| 8,987,602 | B2 | 3/2015 | Hurwitz et al. | |
| 9,449,953 | B1 * | 9/2016 | Shih | H01L 23/5389 |
| 9,978,715 | B2 * | 5/2018 | Huang | H01L 23/49816 |
| 10,157,824 | B2 | 12/2018 | Kang et al. | |
| 10,586,779 | B2 | 3/2020 | Raravikar et al. | |
| 10,672,751 | B2 | 6/2020 | Wu | |
| 11,024,561 | B2 * | 6/2021 | Shim | H01L 24/11 |
| 2002/0113312 | A1 * | 8/2002 | Clatanoff | H01L 23/49827 |
| | | | | 257/737 |
| 2010/0171205 | A1 * | 7/2010 | Chen | H01L 21/565 |
| | | | | 257/692 |
| 2015/0325507 | A1 * | 11/2015 | Uzoh | B23K 35/0266 |
| | | | | 257/737 |
| 2016/0035709 | A1 * | 2/2016 | Chen | H01L 25/105 |
| | | | | 269/302 |
| 2018/0277394 | A1 * | 9/2018 | Huemoeller | H01L 23/5389 |
| 2020/0091077 | A1 * | 3/2020 | Tsai | H01L 21/4857 |
| 2021/0020543 | A1 | 1/2021 | Lee et al. | |
| 2022/0270976 | A1 * | 8/2022 | Sun | H01L 24/14 |

\* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2021-0065607 filed on May 21, 2021 in the Korean Intellectual Property Office, the disclosure of which is hereby incorporated by reference in its entirety.

BACKGROUND

The present inventive concepts relate to a semiconductor package, and, more particularly, to a semiconductor package including a redistribution substrate; and a method of fabricating the same.

A semiconductor package may be provided in an integrated circuit chip to qualify for use in some electronic products. A semiconductor package is typically configured such that a semiconductor chip is mounted on a printed circuit board and bonding wires and/or bumps are used to electrically connect the semiconductor chip to the printed circuit board. With the development of electronic industry, various researches have been conducted to improve reliability and durability of these semiconductor packages.

SUMMARY

Some embodiments of the present inventive concepts provide a semiconductor package with improved electrical properties and a method of fabricating the same.

Some embodiments of the present inventive concepts provide a semiconductor package with improved thermal and mechanical properties.

According to some embodiments of the present inventive concepts, a semiconductor package may comprise: a first redistribution substrate; a solder ball on a bottom surface of the first redistribution substrate; a second redistribution substrate; a semiconductor chip between a top surface of the first redistribution substrate and a bottom surface of the second redistribution substrate; a conductive structure electrically connecting the first redistribution substrate and the second redistribution substrate, the conductive structure laterally spaced apart from the semiconductor chip and including a first conductive structure and a second conductive structure in direct contact with a top surface of the first conductive structure; and a conductive seed pattern between the first redistribution substrate and the first conductive structure. A material of first conductive structure and a material of the second conductive structure may be different from a material of the solder ball.

According to some embodiments of the present inventive concepts, a semiconductor package may comprise: a first redistribution substrate; a second redistribution substrate; a semiconductor chip between a top surface of the first redistribution substrate and a bottom surface the second redistribution substrate; a conductive structure electrically connecting the first redistribution substrate and the second redistribution substrate, and the conductive structure laterally spaced apart from the semiconductor chip and including a first conductive structure and a second conductive structure in direct contact with a top surface of the first conductive structure; and a conductive seed pattern between the first redistribution substrate and the conductive structure. The top surface of the first conductive structure may include a central region and an edge region, and the central region may be at a higher level higher than the edge region.

According to some embodiments of the present inventive concepts, a semiconductor package may comprise: a first redistribution substrate, the first redistribution substrate including a first dielectric layer, a first seed pattern, and a first conductive pattern on the first seed pattern, the first dielectric layer including a first photoimageable polymer; a solder ball on a bottom surface of the first redistribution substrate; a second redistribution substrate, the second redistribution substrate including a second dielectric layer, a second seed pattern, and a second conductive pattern on the second seed pattern, the second dielectric layer including a second photoimageable polymer; a semiconductor chip between a top surface of the first redistribution substrate and a bottom surface the second redistribution substrate; a conductive structure electrically connecting the first redistribution substrate and the second redistribution substrate, the conductive structure laterally spaced apart from the semiconductor chip and including a first conductive structure and a second conductive structure in direct contact with a top surface of the first conductive structure; a conductive seed pattern between the first redistribution substrate and the conductive structure; and a molding layer between the first redistribution substrate and the second redistribution substrate, the molding layer covering at least a sidewall of the semiconductor chip and a sidewall of the conductive structure, and exposing a top surface of the conductive structure. The bottom surface of the second redistribution substrate may be in physical contact with the molding layer A material of the first conductive structure and a material of the second conductive structure may be different from a material of the solder ball.

BRIEF DESCRIPTION OF THE DRAWINGS

The above and other objects and features of the present disclosure will become apparent by describing in detail embodiments thereof with reference to the accompanying drawings.

DETAILED DESCRIPTION OF EMBODIMENTS

Figure 1A:
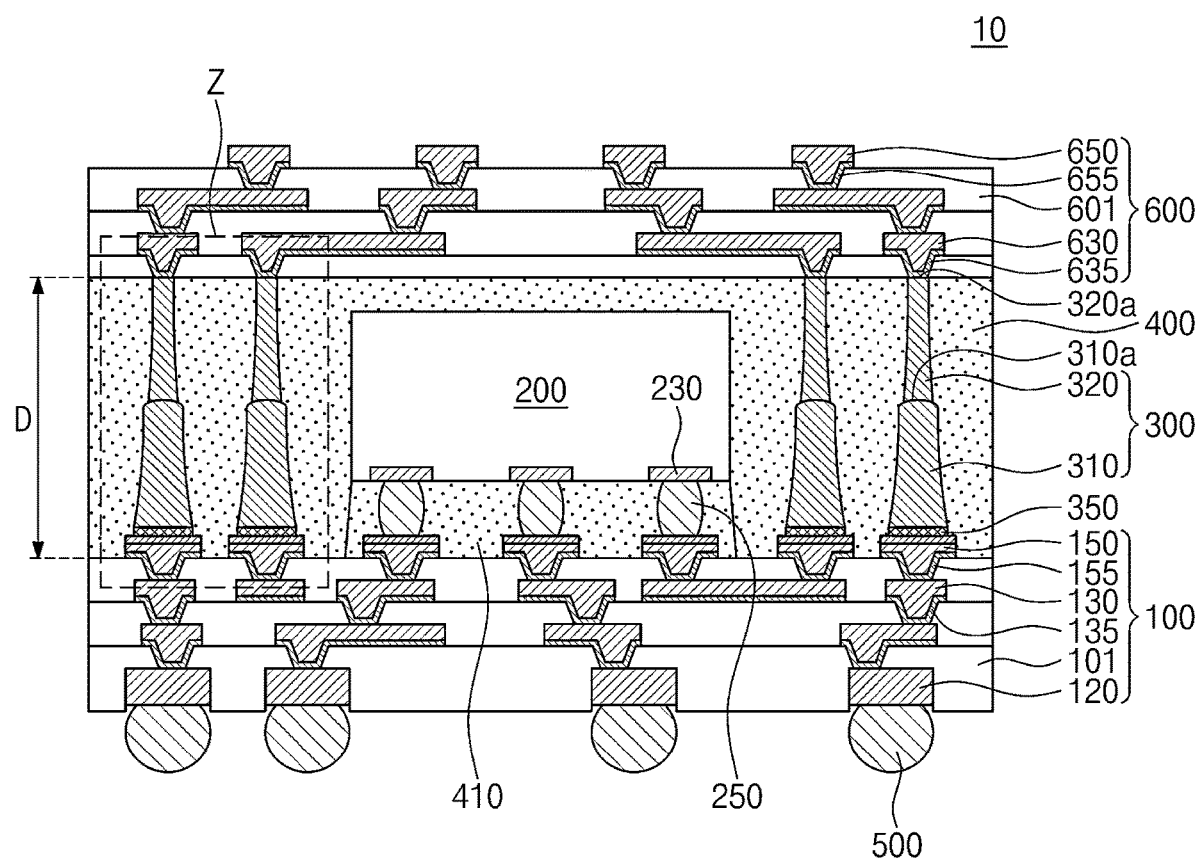
FIG. 1A illustrates a cross-sectional view showing a semiconductor package according to some embodiments.

In this description, like reference numerals may indicate like components. The following will now describe semiconductor packages and their fabrication methods according to the present inventive concepts. When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Although the terms "first," "second," "third," etc., may be used herein to describe various elements, components, regions, layers, and/or sections, these terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "top," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly.

Figure 1B:
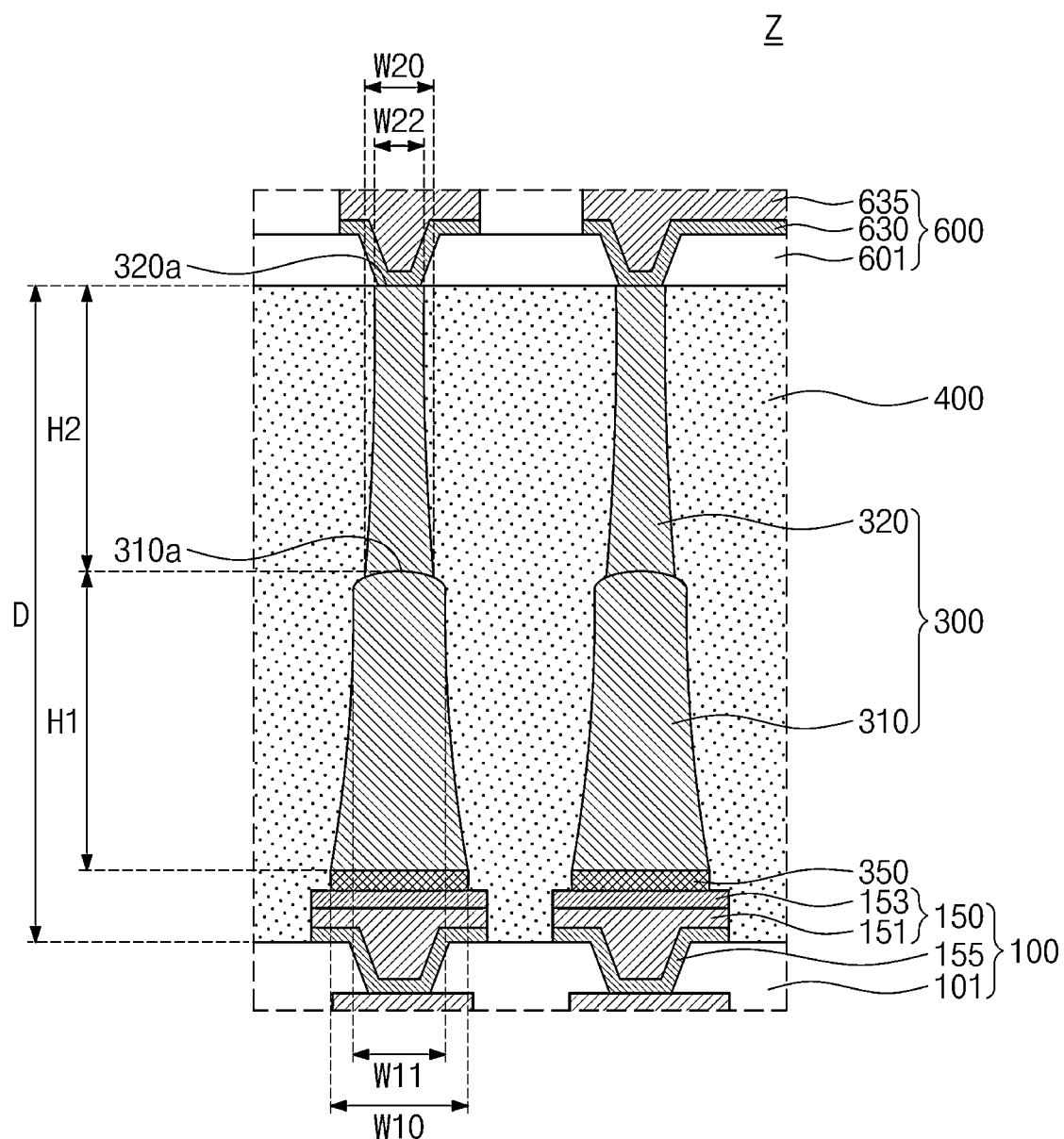
FIG. 1B illustrates an enlarged view showing section Z of FIG. 1A.

FIG. 1A illustrates a cross-sectional view showing a semiconductor package according to some embodiments. FIG. 1B illustrates an enlarged view showing section Z of FIG. 1A.

Referring to FIGS. 1A and 1B, a semiconductor package 10 may be a lower package. The semiconductor package 10 may include a first redistribution substrate 100, solder balls 500, a semiconductor chip 200, conductive structures 300, a molding layer 400, and a second redistribution substrate 600.

The first redistribution substrate 100 may include a first dielectric layer 101, under-bump patterns 120, first redistribution patterns 130, first seed patterns 135, first seed pads 155, and first redistribution pads 150. The first dielectric layer 101 may include an organic material. For example, the first dielectric layer 101 may include a photoimageable dielectric (PID) material. The photoimageable dielectric material may be a polymer. The photoimageable dielectric material may include, for example, at least one selected from a photosensitive polyimide, a polybenzoxazole, a phenolic polymers, benzocyclobutene polymers, and/or the like. The first dielectric layer 101 may be provided in plural, and/or the number of stacked first dielectric layers 101 may be variously changed. For example, the first dielectric layers 101 may include a plurality of layers comprising the same material as each other. An instinct interface may be provided between neighboring first dielectric layers 101.

In some embodiments, the under-bump patterns 120 may be provided in, at least, a lowermost one of the first dielectric layers 101. A bottom surface of the under-bump patterns 120 may be exposed by the first dielectric layer 101, for example the under-bump patterns 120 may have their bottom surfaces not covered by the lowermost layer of the first dielectric layer 101. The under-bump patterns 120 may serve as pads of the solder balls 500. The under-bump patterns 120 may be laterally spaced apart and electrically insulated from each other. Herein, the phrase "two components are laterally spaced apart from each other" may mean "two components are horizontally spaced apart from each other," wherein the term "horizontally" may mean "parallel to a bottom surface of the first redistribution substrate 100." The bottom surface of the first redistribution substrate 100 may be a bottom surface of the lowermost first dielectric layer 101. The lowermost first dielectric layer 101 may cover top surfaces and sidewalls of the under-bump patterns 120. The under-bump patterns 120 may include a conductive material, such as a metal and/or metallic material (e.g., copper).

The first redistribution patterns 130 may be provided on and electrically connected to corresponding under-bump patterns 120. The first redistribution patterns 130 may be laterally spaced apart and electrically separated from each other. The first redistribution patterns 130 may include a conductive material, such as a metal and/or metallic material (e.g., copper).

Each of the first redistribution patterns 130 may include a first via part and a first wire part. The first via part may be provided in a corresponding first dielectric layer 101. For example, the first via part may partially penetrate the first dielectric layer 101. A width at a top surface of the first via part may be greater than a width at a bottom surface of the first via part. The first wire part may be provided on the first via part, and the first wire part and the first via part may be connected to each other with no interface therebetween. For example, the first wire part and the first via part may form an integrated body. A width of the first wire part may be greater than the width at the top surface of the first via part. The first wire part may extend onto a top surface of a corresponding first dielectric layer 101. In this description, the component "via" may be a constituent for vertical connection and the component "wire" may be a constituent for horizontal connection, wherein the term "vertically/perpendicularly" may mean "vertical/perpendicular to the bottom surface of the first redistribution substrate 100." In this description, the term "level" may mean a vertical level, and a level difference may be measured in a direction perpendicular to the bottom surface of the first redistribution substrate 100. The phrase "certain components are the same in terms of level and width" may include an allowable tolerance possibly occurring during fabrication process.

The first redistribution patterns 130 may include a lower redistribution pattern and an upper redistribution patterns stacked on the lower redistribution pattern. The upper redistribution pattern may be disposed on and coupled to the lower redistribution pattern. The under-bump patterns 120 may be coupled to corresponding first redistribution pads 150 through corresponding lower and upper redistribution patterns. The number of the first redistribution patterns 130 stacked between the under-bump patterns 120 and the first redistribution pads 150 is not limited to that shown, but may be variously changed.

The first seed patterns 135 may be correspondingly disposed on bottom surfaces of the first redistribution patterns 130. For example, each of the first seed patterns 135 may cover a bottom surface of the first wire part included in a corresponding first redistribution pattern 130, and may also cover a bottom surface and a sidewall of the first via part included in a corresponding first redistribution pattern 130. Each of the first seed patterns 135 may not extend onto a sidewall of the first wire part included in a corresponding first redistribution pattern 130. The first seed patterns 135 may include a material different from that of the under-bump patterns 120 and that of the first redistribution patterns 130. The first seed patterns 135 may include a conductive seed material. The conductive seed material may include one or more of copper, titanium, and/or an alloy thereof. In some embodiments, the first seed patterns 135 may serve as barrier layers to prevent diffusion of materials included in the first redistribution patterns 130.

The first redistribution pads 150 may be provided on the first redistribution patterns 130 and may be coupled to corresponding second redistribution patterns 630 (e.g., through the conductive structures 300, described below in further detail). The first redistribution pads 150 may be laterally spaced apart from each other. As the first redistribution patterns 130 are provided, at least one first redistribution pad 150 may not be vertically aligned with the under-bump pattern 120 electrically connected thereto. Therefore, it may be possible to more freely design an arrangement of the under-bump patterns 120 and/or an arrangement of the first redistribution pads 150.

The first redistribution pads 150 may be provided in an uppermost first dielectric layer 101, and may extend onto a top surface of the uppermost first dielectric layer 101. Each of the first redistribution pads 150 may include a conductive pad 151 and a bonding pad 153 as shown in FIG. 1B. The conductive pad 151 may include a conductive material (e.g., a metal such as copper). The conductive pad 151 may have a lower portion disposed in the uppermost first dielectric layer 101. The conductive pad 151 may have an upper portion that extends onto the top surface of the uppermost first dielectric layer 101. The upper portion of the conductive pad 151 may have width greater than that at the lower portion of the conductive pad 151. The bonding pad 153 may be provided on the conductive pad 151. The bonding pad 153 may have a thickness less than that of the conductive pad 151. The bonding pad 153 may include a material different from that of the conductive pad 151. For example, the bonding pad 153 may include one or more of nickel, gold, and/or an alloy thereof. The bonding pad 153 may serve as a protection layer and/or an adhesion layer.

The first seed pads 155 may be correspondingly provided on bottom surfaces of the first redistribution pads 150. The first seed pads 155 may be correspondingly provided between the first redistribution pads 150 and upper redistribution patterns of the first redistribution patterns 130, and may extend between the uppermost first dielectric layer 101 and the first redistribution pads 150. The first seed pads 155 may include a material different from that of the first redistribution pads 150. The first seed pads 155 may include, for example, a conductive seed material. For example, the first seed pads 155 and the first seed patterns 135 may include the same or different materials.

As shown in FIG. 1A, the solder balls 500 may be disposed on the bottom surface of the first redistribution substrate 100. For example, the solder balls 500 may be correspondingly disposed on the bottom surfaces of the under-bump patterns 120, thereby being coupled to corresponding under-bump patterns 120. The solder balls 500 may be electrically connected through the under-bump patterns 120 to the first redistribution patterns 130. The solder balls 500 may be electrically separated from each other. The solder balls 500 may include a solder material. The solder material may include, for example, copper, tin, bismuth, lead, silver, and/or an alloy thereof. The solder material may be a eutectic alloy. The solder balls 500 may be used to electrically connect the semiconductor package 10 to an electronic device and/or system (not illustrated).

The semiconductor chip 200 may be mounted on a top surface of the first redistribution substrate 100. When viewed in plan, the semiconductor chip 200 may be disposed in (and/or near) a central region of the first redistribution substrate 100. The semiconductor chip 200 may be at least one of a logic chip, a buffer chip, and/or a memory chip. For example, the semiconductor chip 200 may be a logic chip. The semiconductor chip 200 may include an application specific integrated circuit (ASIC) chip and/or an application processor (AP) chip. The ASIC chip may include an application specific integrated circuit (ASIC). Alternatively, the semiconductor chip 200 may include a central processing unit (CPU) and/or a graphic processing unit (GPU).

The semiconductor chip 200 may have a top surface and a bottom surface that are opposite to each other. The bottom surface of the semiconductor chip 200 may be an active surface directed toward the first redistribution substrate 100. The top surface of the semiconductor chip 200 may be an inactive surface. For example, the semiconductor chip 200 may include a semiconductor substrate, integrated circuits, and chip pads 230. The semiconductor substrate may include at least one of a silicon substrate, a germanium substrate, and/or a silicon-germanium substrate. For example, the semiconductor substrate may be a silicon wafer. The integrated circuits may be adjacent to the bottom surface of the semiconductor chip 200. The chip pads 230 may be coupled to the integrated circuits. The phrase "a certain component is electrically connected to the semiconductor chip 200" may mean "a certain component is electrically connected" (e.g., through the chip pads 230) "to the integrated circuits of the semiconductor chip 200."

Bumps 250 may be interposed between the first redistribution substrate 100 and the semiconductor chip 200. For example, the bumps 250 may be provided between and coupled to the first redistribution pads 150 and the chip pads 230. Therefore, the semiconductor chip 200 may be coupled through the bumps 250 to the first redistribution substrate 100. The phrase "coupled to the first redistribution substrate 100" may mean "coupled to at least one of the first redistribution patterns 130." The bumps 250 may include solder balls. The bumps 250 may include a solder material. The bumps 250 may further include pillar patterns, and the pillar patterns may include metal, such as copper, tin, bismuth, lead, silver, and/or an alloy thereof. The solder material may be a eutectic alloy. For example, the pillar patterns may be in contact with the chip pads 230.

The semiconductor package 10 may further include an under-fill layer 410. The under-fill layer 410 may be provided in a gap between the first redistribution substrate 100 and the semiconductor chip 200, thereby covering sidewalls of the bumps 250. The under-fill layer 410 may include a dielectric polymer, such as an epoxy polymer.

The conductive structures 300 may be disposed on the top surface of the first redistribution substrate 100. When viewed in plan, the conductive structures 300 may be disposed on an edge region of the first redistribution substrate 100. For example, when viewed in plan, the edge region of the first redistribution substrate 100 may be provided between the central region and a sidewall of the first redistribution substrate 100. When viewed in plan, the edge region may surround the central region of the first redistribution substrate 100. The conductive structures 300 may be laterally spaced apart from the semiconductor chip 200. The conductive structures 300 may be laterally spaced apart from each other. The conductive structures 300 may be provided on (and/or coupled to) corresponding first redistribution pads 150. Therefore, the conductive structures 300 may be coupled to the first redistribution substrate 100. The conductive structures 300 may be electrically connected through the first redistribution substrate 100 to the solder balls 500 and/or the semiconductor chip 200.

Conductive seed patterns 350 may be correspondingly disposed between (and/or coupled to) the conductive structures 300 and the first redistribution pads 150. For example, as shown in FIG. 1B, the conductive seed patterns 350 may be coupled to corresponding bonding pads 153. The conductive seed patterns 350 may have widths the same as or less than those at top surfaces of the first redistribution pads 150. The conductive seed patterns 350 may include a material different from that of the first redistribution pads 150 and that of the conductive structures 300. For example, the conductive seed patterns 350 may include a conductive seed material. For example, the conductive seed patterns 350 may include titanium or an alloy including copper and titanium, and the conductive structures 300 may include copper. For example, the conductive see patterns 350 may include the same and/or different materials to the first seed pads 155 and/or the first seed patterns 135.

Each of the conductive structures 300 may include a first conductive structure 310 and a second conductive structure 320. The first conductive structure 310 may be disposed directly on (and/or in contact with) a corresponding conductive seed pattern 350. The first conductive structure 310 may include, e.g., a metal pillar. For example, the first conductive structure 310 may be a metal pillar having a tapered shape. As shown in FIG. 1B, the first conductive structure 310 may have a first width W10 at a bottom surface thereof. The first width W10 may be greater than a width W11 at a top surface 310a of the first conductive structure 310. The first width W10 may be a maximum width of the first conductive structure 310. A width at a lower portion of the first conductive structure 310 may be greater than a width at an upper portion of the first conductive structure 310. The first conductive structure 310 may have a width that decreases in a direction from the lower portion thereof toward the upper portion thereof.

The first conductive structure 310 may have a dome shape at the top surface 310a thereof. For example, the top surface 310a of the first conductive structure 310 may be upwardly convex. For example, a central region at the top surface 310a of the first conductive structure 310 may be located at a level higher than that of an edge region at the top surface 310a of the first conductive structure 310. The edge region at the top surface 310a of the first conductive structure 310 may be provided between a sidewall of the first conductive structure 310 and the central region at the top surface 310a of the first conductive structure 310. The first conductive structure 310 may include a conductive material. For example, the first conductive structure 310 may include a metal such as copper and/or tungsten.

The first conductive structure 310 may have a height that is about 50% to about 300% of the first width W10. In this case, the height of the first conductive structure 310 may be a maximum height of the first conductive structure 310. As the height of the first conductive structure 310 is equal to or greater than about 50% of the first width W10, the conductive structures 300 may have a fine pitch. In addition, as the height of the first conductive structure 310 is equal to or less than about 300% of the first width W10, the first conductive structure 310 may be favorably coupled to a corresponding conductive seed pattern 350, and the first conductive structure 310 may increase in structural stability. Moreover, the first conductive structure 310 may be easily manufactured.

The second conductive structure 320 may be provided on the top surface 310a of the first conductive structure 310. The second conductive structure 320 may be disposed directly on the top surface 310a of the first conductive structure 310. The second conductive structure 320 may be in direct contact with the top surface 310a of the first conductive structure 310 and may be electrically connected to the first conductive structure 310.

The second conductive structure 320 may be a metal pillar having a tapered shape. The second conductive structure 320 may have a second width W20 at a bottom surface thereof. The second width W20 may be less than a width W22 at a top surface 320a of the second conductive structure 320. A width at a lower portion of the second conductive structure 320 may be greater than a width at an upper portion of the second conductive structure 320. For example, the second conductive structure 320 may have a width that decreases in a direction from the bottom surface thereof toward the top surface 320a thereof. The second conductive structure 320 may be flat on the top surface 320a thereof. For example, the top surface 320a of the second conductive structure 320 may be substantially parallel to the bottom surface of the first redistribution substrate 100 and/or to a bottom surface of the second redistribution structure 600. A central portion at the top surface 320a of the second conductive structure 320 may be located at a level substantially the same as that of an edge portion at the top surface 320a of the second conductive structure 320. The top surface 320a of the second conductive structure 320 may correspond to a top surface of a corresponding conductive structure 300.

The second width W20 may be less than the first width W10. For example, a difference between the first width W10 and the second width W20 may be equal to or greater than about 1 μm. Therefore, the second conductive structure 320 may be prevented from being misaligned with the first conductive structure 310. For example, the bottom surface of the second conductive structure 320 may be satisfactorily coupled to the top surface 310a of the first conductive structure 310. The second width W20 may be less than the width W11 at the top surface 310a of the first conductive structure 310. A difference between the first width W10 and the second width W20 may be less than about 50% of the second width W20. Therefore, the second conductive structure 320 may be properly coupled to the first conductive structure 310, and may have increased structural stability.

The second conductive structure 320 may have a height that is about 50% to about 300% of the second width W20. As the height of the second conductive structure 320 is equal to or greater than about 50% of the second width W20, the conductive structures 300 may have a fine pitch. As the height of the second conductive structure 320 is equal to or less than about 300% of the second width W20, the second conductive structure 320 may increase in structural stability and may be easily manufactured. In addition, there may be good connection between the first conductive structure 310 and the second conductive structure 320.

The second conductive structure 320 may include the same material as that of the first conductive structure 310. The second conductive structure 320 may include a conductive material, for example, a metal like copper. The second conductive structure 320 may have a grain structure different from that of the first conductive structure 310.

As shown in FIG. 1A, the molding layer 400 may be provided on a top surface of the first redistribution substrate 100. The molding layer 400 may cover the bottom and lateral surfaces of the semiconductor chip 200, a sidewall of the first conductive structure 310, and/or a sidewall of the second conductive structure 320. The molding layer 400 may further cover a portion of the top surface 310a of the first conductive structure 310 and a sidewall of the conductive seed pattern 350. The molding layer 400 may have a top surface coplanar with those of the conductive structures 300. For example, as shown in FIG. 1B, the top surface of the molding layer 400 may be located at substantially the same level as that of the top surface 320a of the second conductive structure 320. The molding layer 400 may include a dielectric polymer, such as an epoxy-based molding compound. The molding layer 400 may include a dielectric polymer different from that of the under-fill layer 410. Alternatively, the under-fill layer 410 may be omitted, and the molding layer 400 may further extend into a gap between the first redistribution substrate 100 and the semiconductor chip 200. For example, in some embodiments, the molding layer 400 and the under-fill layer 410 may include the same material and/or form an integrated body.

The second redistribution substrate 600 may be disposed on the molding layer 400 and the conductive structures 300 and may be electrically connected to the conductive structures 300. The second redistribution substrate 600 may be spaced apart from the top surface of the semiconductor chip 200. The molding layer 400 may fill a gap between the second redistribution substrate 600 and the top surface of the semiconductor chip 200.

The second redistribution substrate 600 may include a second dielectric layer 601, the second redistribution patterns 630, second seed patterns 635, and second redistribution pads 650. The second dielectric layer 601 may include a plurality of layers. In this case, the plurality of layers of the second dielectric layer 601 may be stacked on the molding layer 400. The second dielectric layer 601 may include a photo-imageable dielectric (PID) material. In some embodiments, the layers of the second dielectric layer 601 may include the same material as each other. An instinct interface may be provided between neighboring layers of the second dielectric layer 601. The number of layers in the second dielectric layer 601 may be variously changed.

The second redistribution patterns 630 may be provided on corresponding conductive structures 300. The second redistribution patterns 630 may be laterally spaced apart and electrically separated from each other. Each of the second redistribution patterns 630 may include a second via part and a second wire part. The second via part may be provided in a corresponding second dielectric layer 601. The second via part of each of lowermost second redistribution patterns 630 may be provided on the top surface 320a of a corresponding second conductive structure 320. The second wire part may be provided on the second via part, and the second wire part and the second via part may be connected to each other with no interface therebetween. The second wire part of each of the second redistribution patterns 630 may have a width greater than that at a top surface of the second via part. The second wire part of each of the second redistribution patterns 630 may extend onto a top surface of a corresponding second dielectric layer 601. The second redistribution patterns 630 may include a conductive material. For example, the second redistribution patterns 630 may include a metal and/or metallic material, such as copper.

The second seed patterns 635 may be correspondingly disposed on bottom surfaces of the second redistribution patterns 630. For example, each of the second seed patterns 635 may be provided on a bottom surface and/or a sidewall of the second via part of a corresponding second redistribution pattern 630, and may extend onto a bottom surface of the second wire part of a corresponding second redistribution pattern 630. The second seed patterns 635 may include a material different from that of the conductive structures 300 and/or that of the second redistribution patterns 630. For example, the second seed patterns 635 may include a conductive seed material. The second seed patterns 635 may serve as barrier layers to prevent diffusion of materials included in the second redistribution patterns 630.

The second redistribution pads 650 may be disposed on and coupled to corresponding second redistribution patterns 630. The second redistribution pads 650 may be disposed on and/or in an upper surface of the dielectric layer 601. The second redistribution pads 650 may be laterally spaced apart from each other. At least one of the second redistribution pads 650 may not be vertically aligned with the conductive structure 300 electrically connected thereto. Accordingly, the second redistribution pads 650 may be more freely designed in terms of arrangement.

Each of the second redistribution pads 650 may have a lower portion provided in an uppermost second dielectric layer 601. Each of the second redistribution pads 650 may have an upper portion that extends onto a top surface of the uppermost second dielectric layer 601. The upper portion of each of the second redistribution pads 650 may have a width greater than that of the lower portion of each of the second redistribution pads 650. The second redistribution pads 650 may include a conductive material such as a metal and/or metallic material (e.g., copper).

The second redistribution substrate 600 may further include second seed pads 655. The second seed pads 655 may be correspondingly interposed between uppermost second redistribution pads 650 and the second redistribution pads 650. The second seed pads 655 may include a conductive seed material.

The second redistribution patterns 630 may include a second lower redistribution pattern and second upper redistribution patterns stacked on the second lower redistribution pattern. The second lower redistribution pattern may be disposed on and coupled to a corresponding conductive structure 300. The second upper redistribution pattern may be disposed on and coupled to the second lower redistribution pattern. Each of the conductive structures 300 may be coupled to a corresponding second redistribution pad 650 through the second lower redistribution pattern and the second upper redistribution pattern. The number of the second redistribution patterns 630 stacked between a certain one conductive structure 300 and its corresponding second redistribution pad 650 may be variously changed, and the number of stacked second redistribution patterns 630 may be variously changed. For example, one, three, or more second redistribution patterns 630 may be provided between the conductive structure 300 and its corresponding second redistribution pad 650.

When each of the conductive structures 300 includes a single conductive structure, restriction related to an aspect ratio there between may limit an interval D between the first redistribution substrate 100 and the second redistribution substrate 600. For example, when one of the first and second conductive structures 310 and 320 is omitted, the interval D between the first and second redistribution substrates 100 and 600 may be less than about 200 μm. According to some embodiments, as each of the conductive structures 300 includes the first conductive structure 310 and the second conductive structure 320, each of the conductive structures 300 may have a relatively large height. Therefore, it may be possible to more freely control the interval D between the first redistribution substrate 100 and the second redistribution substrate 600. For example, the interval D between the first and second redistribution substrates 100 and 600 may be greater than 200 μm and/or range from about 200 μm to about 300 μm. The interval D between the first and second redistribution substrates 100 and 600 may be an interval between an uppermost first dielectric layer 101 and a lowermost second dielectric layer 601. When the interval D between the first and second redistribution substrates 100 and 600 is equal to or greater than about 200 μm, the semiconductor chip 200 having a large thickness may be provided between the first redistribution substrate 100 and the second redistribution substrate 600. For example, the semiconductor chip 200 may have a semiconductor substrate whose thickness is increased. The semiconductor substrate of the semiconductor chip 200 may have a high thermal conductivity, and thus the semiconductor chip 200 may improve in thermal radiation properties. The semiconductor substrate of the semiconductor chip 200 may have a relatively high strength, and thus the semiconductor chip 200 may improve in mechanical properties. The semiconductor substrate of the semiconductor chip 200 may have a coefficient of thermal expansion (CTE) less than that of the molding layer 400, and thus the semiconductor chip 200 may be prevented from warpage. As the interval D between the first and second redistribution substrates 100 and 600 is equal to or less than about 300 μm, the semiconductor package 10 may maintain a relatively small size.

The following will describe conductive structures according to some embodiments. A duplicate description discussed above will be omitted below.

Figure 1C:
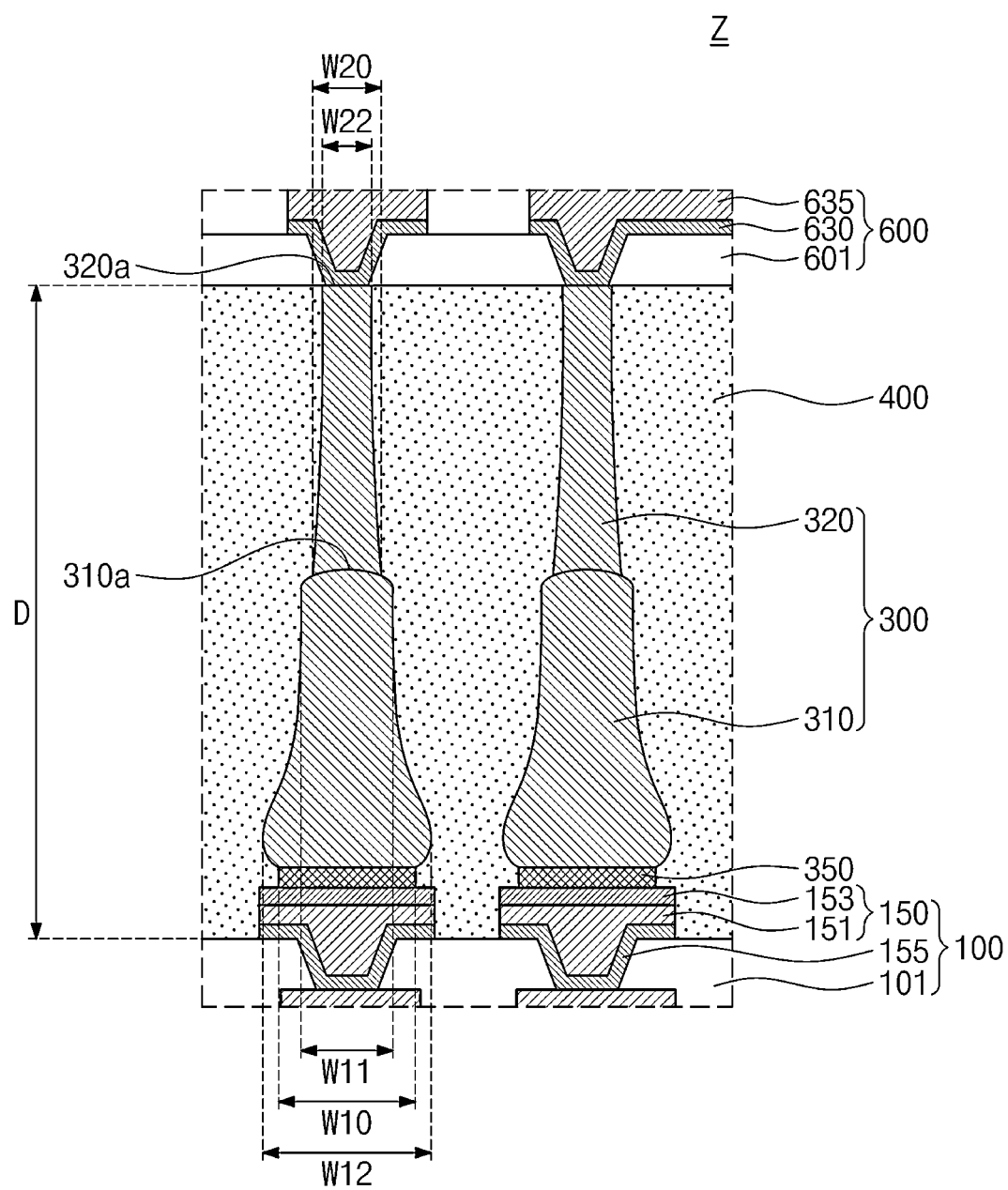
FIG. 1C illustrates a cross-sectional view showing conductive structures according to some embodiments.

FIG. 1C illustrates an enlarged view of section Z depicted in FIG. 1A, showing conductive structures according to some embodiments.

Referring to FIG. 1C, each of the conductive structures 300 may include a first conductive structure 310 and a second conductive structure 320. The first conductive structure 310 may be similar to the first conductive structure 310 discussed in FIGS. 1A and 1B. For example, the first width W10 may be greater than the width W11 at the top surface 310a of the first conductive structure 310. In some embodiments, the first conductive structure 310 may have a maximum width W12 at a first part thereof. The first part of the first conductive structure 310 may be located at a level higher than that of the bottom surface of the first conductive structure 310. The first part of the first conductive structure 310 may correspond to a lower portion of the first conductive structure 310. For example, an interval between the first part of the first conductive structure 310 and the lower portion of the first conductive structure 310 may be less than an interval between the first part of the first conductive structure 310 and the top surface 310a of the first conductive structure 310. The first conductive structure 310 may have a width that increases in a direction from the bottom surface thereof toward the first part thereof. The first conductive structure 310 may have a width that decreases in a direction from the first part thereof toward the top surface 310a thereof.

The second conductive structure 320 may be substantially the same as that discussed in FIGS. 1A and 1B.

Figure 2:
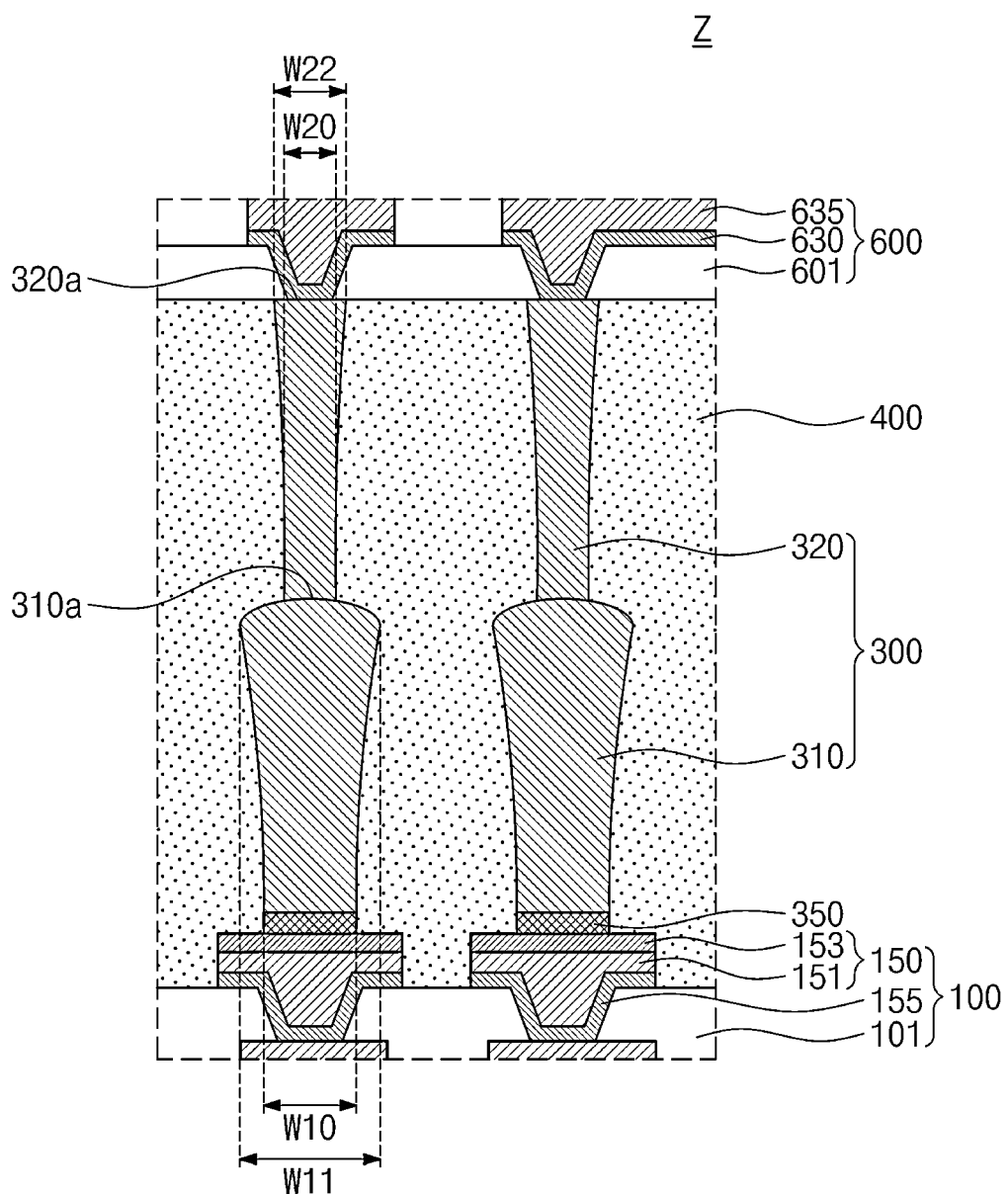
FIG. 2 illustrates a cross-sectional view showing conductive structures according to some embodiments.

FIG. 2 illustrates an enlarged view of section Z depicted in FIG. 1A, showing conductive structures according to some embodiments.

Referring to FIG. 2, each of the conductive structures 300 may include a first conductive structure 310 and a second conductive structure 320. The first conductive structure 310 may be similar to the first conductive structure 310 discussed in FIGS. 1A and 1B. However, the first width W10 may be less than the width W11 at the top surface 310a of the first conductive structure 310. The first conductive structure 310 may have a width that increases in a direction from the bottom surface thereof toward the top surface 310a thereof.

The second conductive structure 320 may be similar to the second conductive structure 320 discussed in FIGS. 1A and 1B. However, the second width W20 may be less than the width W22 at the top surface 320a of the second conductive structure 320. The second conductive structure 320 may have a width that increases in a direction from the bottom surface thereof toward the top surface 320a thereof.

The first width W10 may be greater than the second width W20. A difference between the first width W10 and the second width W20 may be greater than about 1 μm and less than about 50% of the second width W20.

Figure 3A:
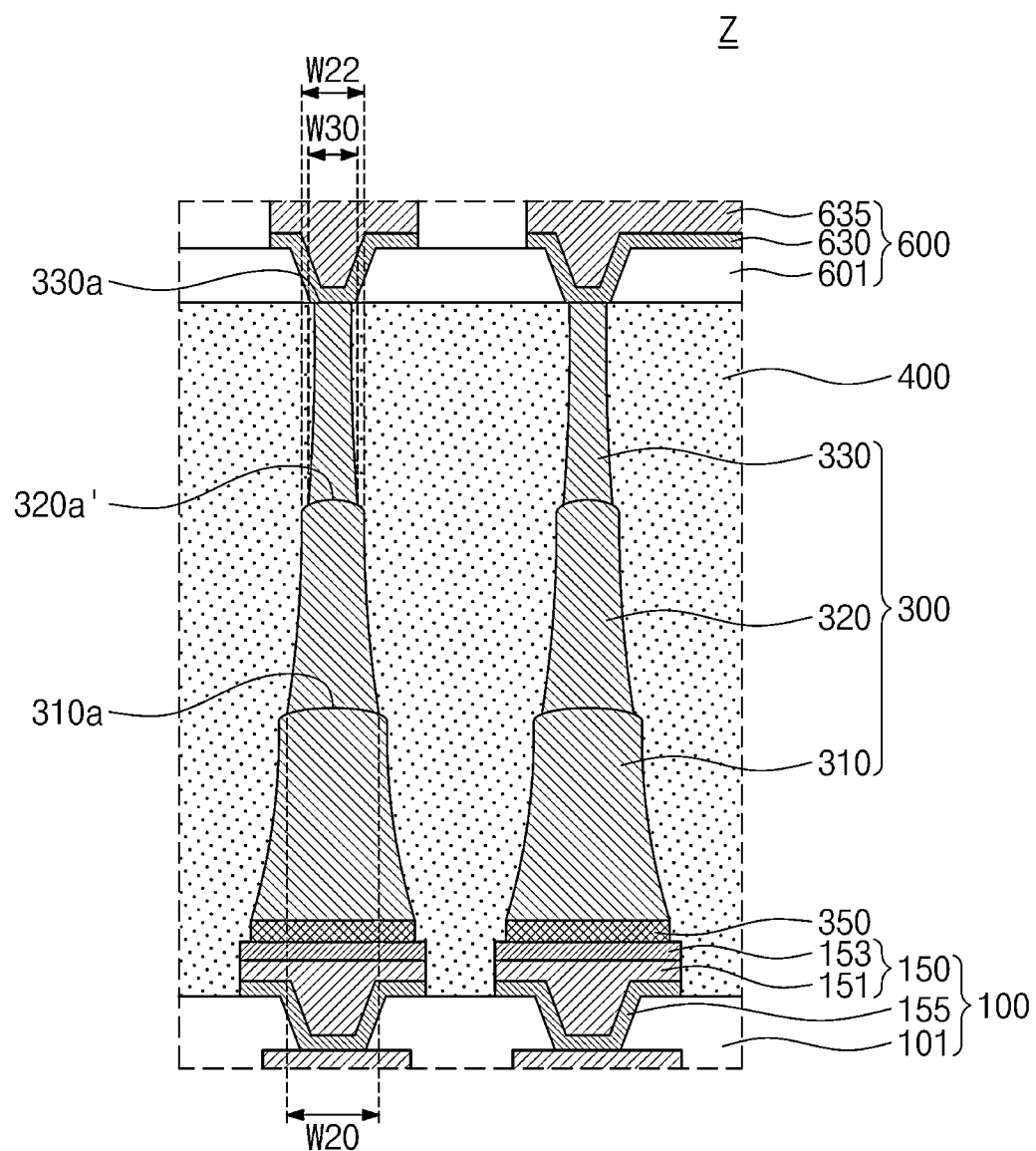
FIG. 3A illustrates a cross-sectional view showing conductive structures according to some embodiments.

FIG. 3A illustrates an enlarged view of section Z depicted in FIG. 1A, showing conductive structures according to some embodiments.

Referring to FIG. 3A, each of the conductive structures 300 may include a first conductive structure 310, a second conductive structure 320, and a third conductive structure 330. The first conductive structure 310 may be substantially similar to the first conductive structure 310 discussed in FIGS. 1A and 1B. The second conductive structure 320 may be substantially similar to the second conductive structure 320 discussed in FIGS. 1A and 1B. However, the second conductive structure 320 may have a dome shape at a top surface 320a' thereof. For example, a central region (at the top surface 320a') of the second conductive structure 320 may be located at a level higher than an edge region (at the top surface 320a') of the second conductive structure 320.

The third conductive structure 330 may be disposed on the top surface 320a' of the second conductive structure 320. The third conductive structure 330 may be in direct contact with the top surface 320a' of the second conductive structure 320. The third conductive structure 330 may include the same material as that of the second conductive structure 320, and/or may have a grain different from that of the second conductive structure 320. The third conductive structure 330 may have a third width W30 at a bottom surface thereof. The third width W30 may be less than the second width W20.

The third conductive structure 330 may include a pillar and may have a tapered shape. For example, the third width W30 may be greater than a width W33 at a top surface 330a of the third conductive structure 330. The third conductive structure 330 may have a width that decreases in a direction from the bottom surface thereof toward the top surface 330a thereof. A difference between the second width W20 and the third width W30 may be greater than about 1 μm. The difference between the second width W20 and the third width W30 may be less than about 50% of the third width W30. The third conductive structure 330 may have a height that is about 50% to about 300% of the third width W30.

The top surface 330a of the third conductive structure 330 may be flat. One of the second seed patterns 635 may be in contact with the top surface 330a of the third conductive structure 330. The second redistribution pattern 630 may be electrically connected through a corresponding second seed pattern 635 to the third conductive structure 330.

Figure 3B:
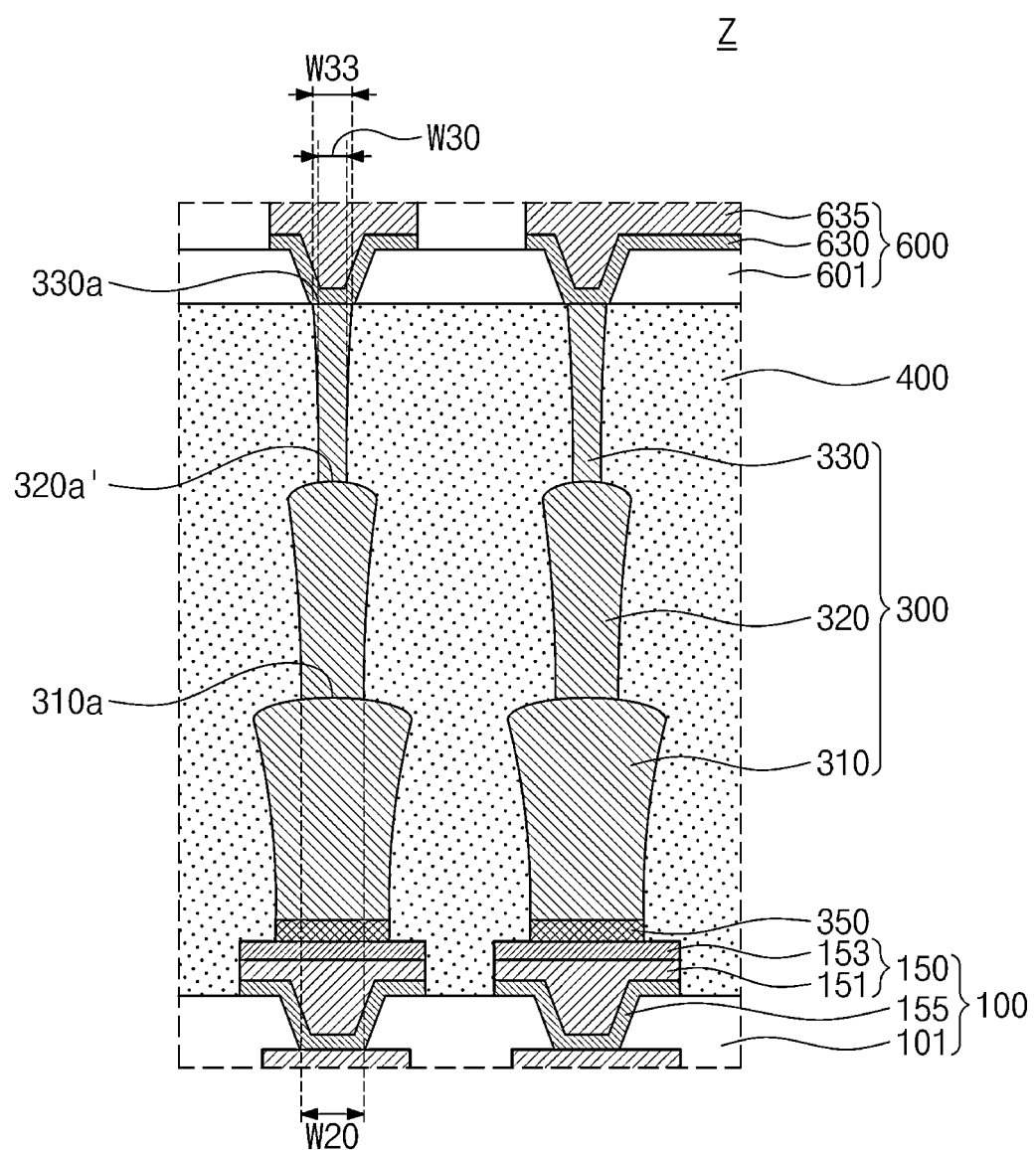
FIG. 3B illustrates a cross-sectional view showing conductive structures according to some embodiments.

FIG. 3B illustrates an enlarged view of section Z depicted in FIG. 1A, showing conductive structures according to some embodiments.

Referring to FIG. 3B, each of the conductive structures 300 may include a first conductive structure 310, a second conductive structure 320, and a third conductive structure 330. The first conductive structure 310 may be substantially the same as the first conductive structure 310 discussed in FIG. 2, and/or likewise a shape of the second conductive structure 320 may be substantially the similar to the second conductive structure 320 discussed in FIG. 2. However, the second conductive structure 320 may be upwardly convex on a top surface 320a' thereof.

The third conductive structure 330 may be disposed on the top surface 320a' of the second conductive structure 320. The third conductive structure 330 may be substantially the same as that discussed in FIG. 3A. For example, the third width W30 may be less than the second width W20. The third width W30 may be less than the width W33 at the top surface 330a of the third conductive structure 330. The third conductive structure 330 may have a width that increases in a direction from the bottom surface thereof toward the top surface 330a thereof. The third conductive structure 330 may have a height that is about 50% to about 300% of the third width W30.

Differently from that shown, the first conductive structure 310 of FIGS. 3A and 3B may have a shape substantially similar to that discussed in the example of FIG. 1C.

Figure 4:
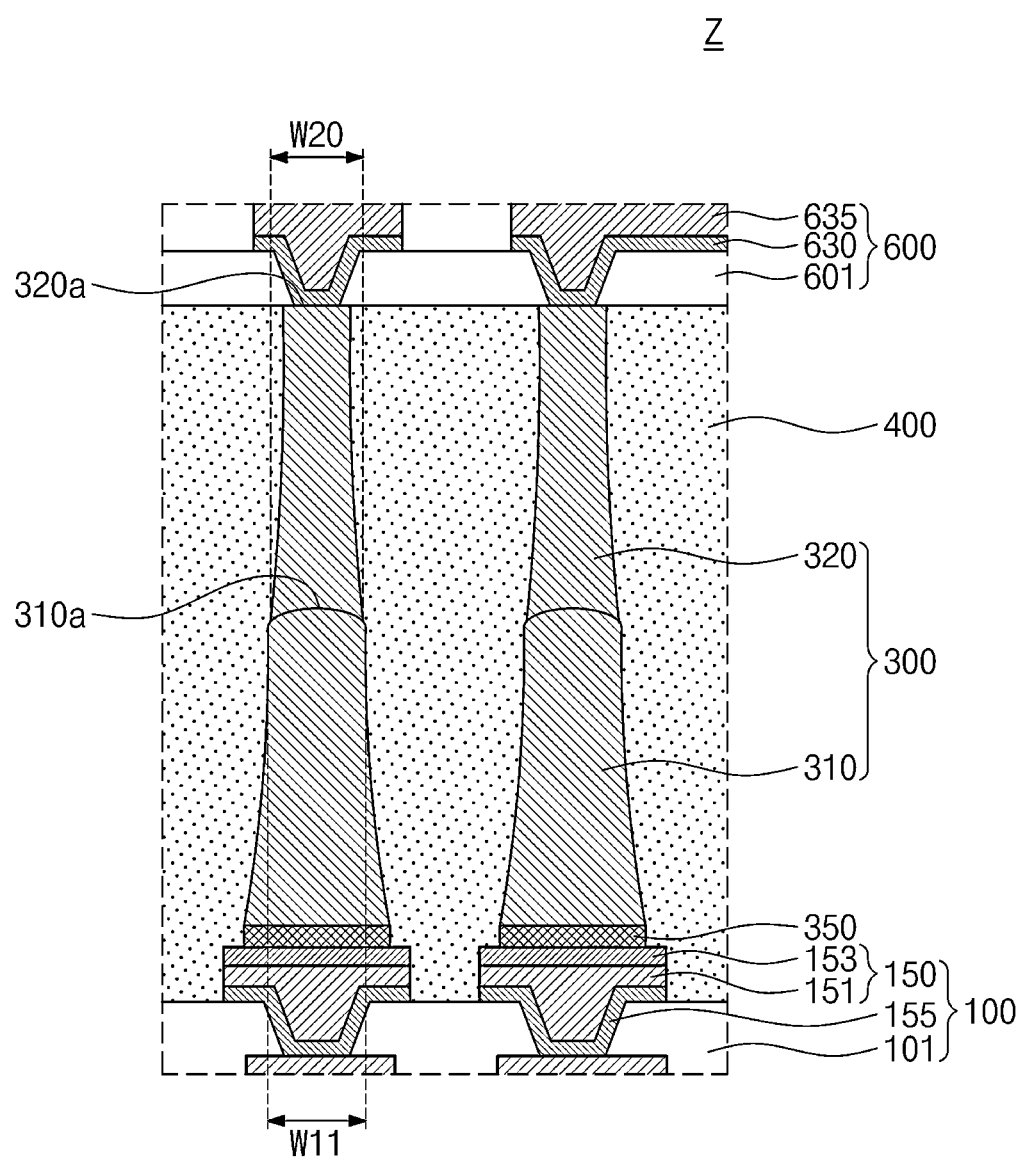
FIG. 4 illustrates a cross-sectional view showing conductive structures according to some embodiments.

FIG. 4 illustrates an enlarged view of section Z depicted in FIG. 1A, showing conductive structures according to some embodiments.

Referring to FIG. 4, each of the conductive structures 300 may include a first conductive structure 310 and a second conductive structure 320. The first conductive structure 310 and the second conductive structure 320 may be substantially similar to those discussed in FIGS. 1A and 1B, except, the second width W20 may be substantially the same as the width W11 at the top surface 310a of the first conductive structure 310. Additionally, though not illustrated, the first conductive structure 310 of FIG. 4 may have a shape substantially similar to that discussed in the example of FIG. 1C.

Figure 5A:
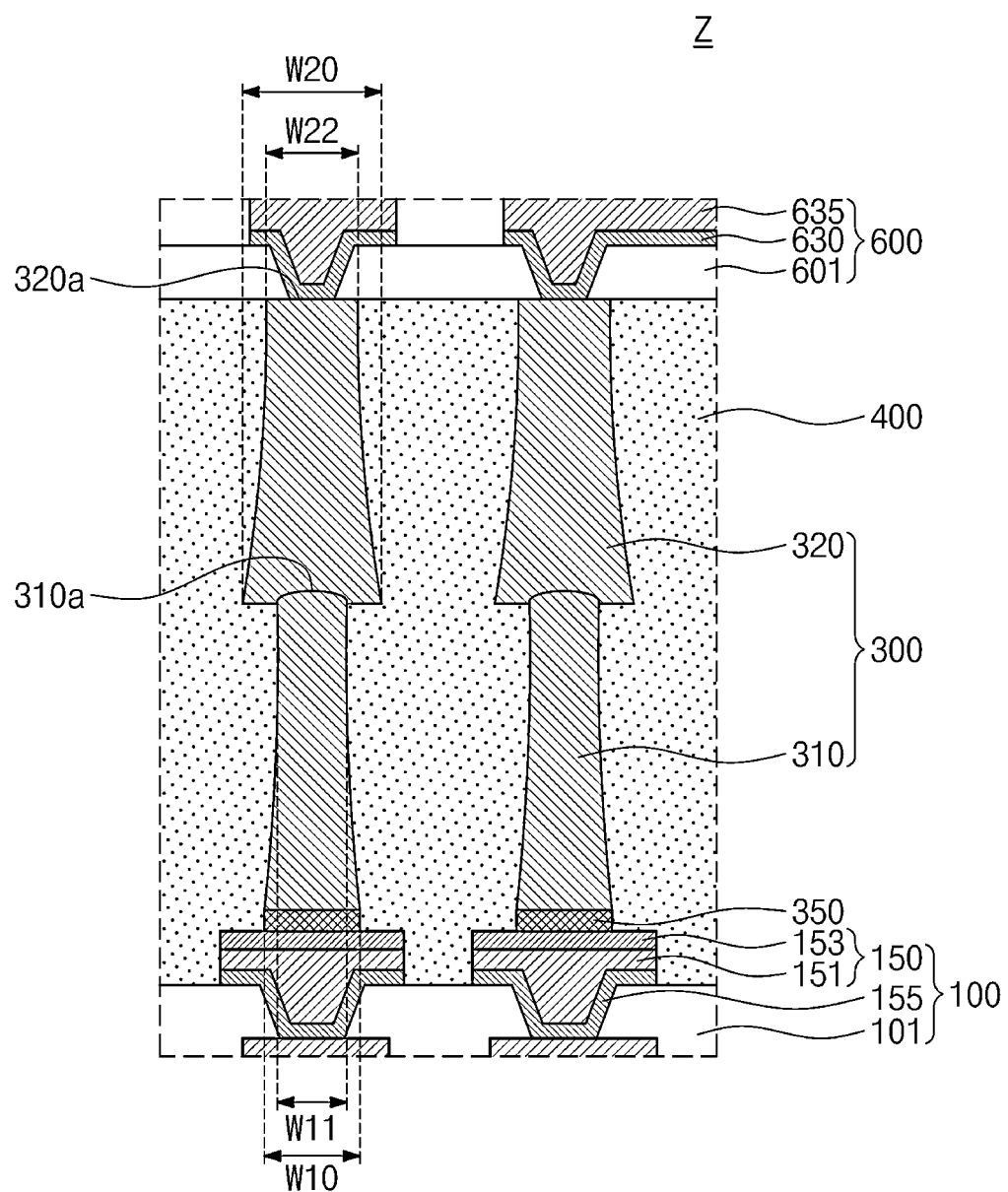
FIG. 5A illustrates a cross-sectional view showing conductive structures according to some embodiments.

FIG. 5A illustrates an enlarged view of section Z depicted in FIG. 1A, showing conductive structures according to some embodiments.

Referring to FIG. 5A, a first conductive structure 310 and a second conductive structure 320 may be similar to those discussed in the example of FIGS. 1A and 1B. For example, the first width W10 may be greater than the width W11 at the top surface 310a of the first conductive structure 310. The second width W20 may be greater than the width W22 at the top surface 320a of the second conductive structure 320.

However, the first width W10 may be less than the second width W20. A difference between the first width W10 and the second width W20 may be greater than about 1 μm and less than about 50% of the second width W20. Additionally, differently from that shown, the first conductive structure 310 may have a shape substantially the same as that discussed in the example of FIG. 1C.

Figure 5B:
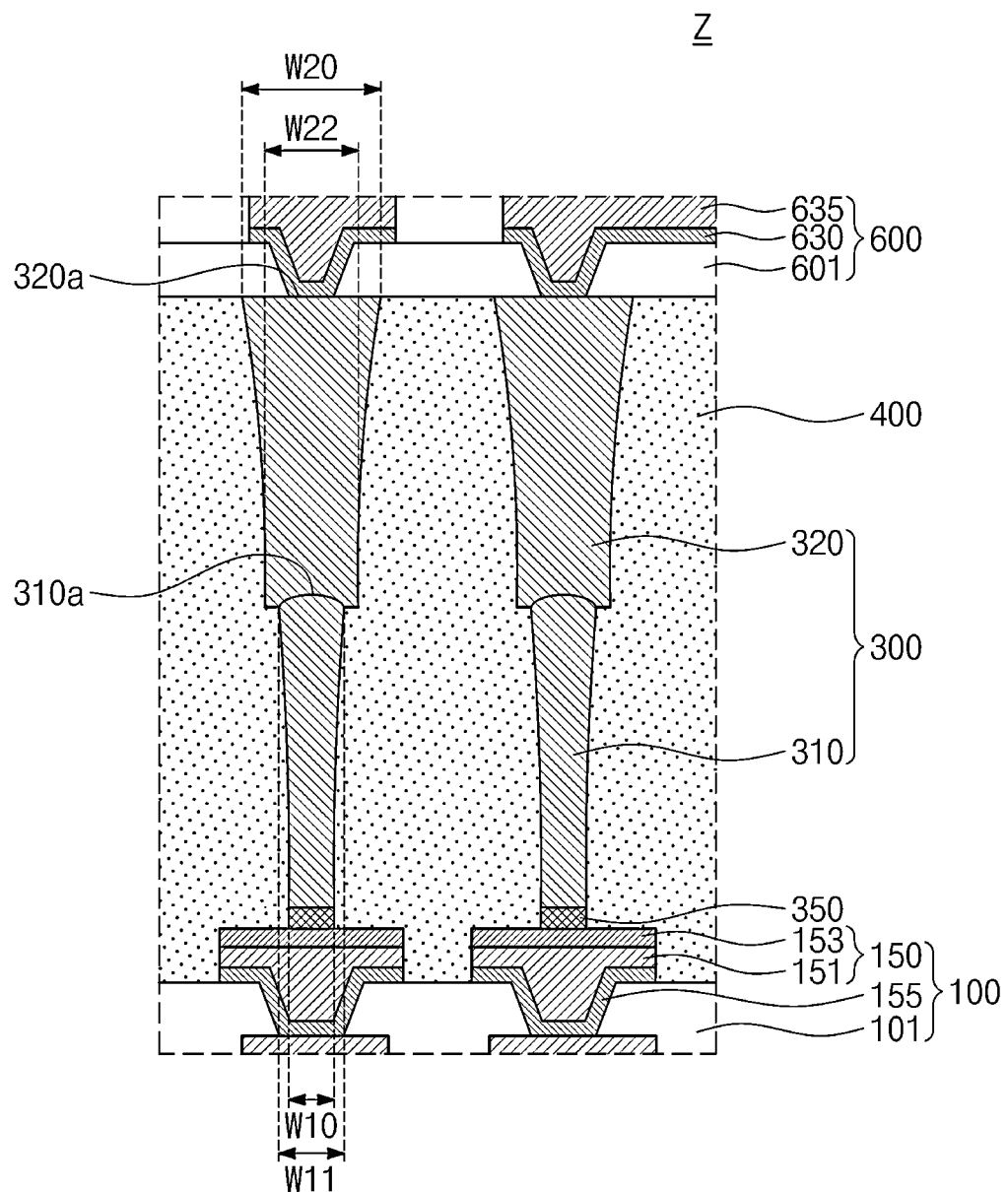
FIG. 5B illustrates a cross-sectional view showing conductive structures according to some embodiments.

FIG. 5B illustrates an enlarged view of section Z depicted in FIG. 1A, showing conductive structures according to some embodiments.

Referring to FIG. 5B, a first conductive structure 310 and a second conductive structure 320 may be substantially similar to those discussed in the example of FIG. 2. However, for example, the first width W10 may be less than the width W11 at the top surface 310a of the first conductive structure 310 and/or the second width W20 may be less than the width W22 at the top surface 320a of the second conductive structure 320. Additionally, the first width W10 may be less than the second width W20. A difference between the first width W10 and the second width W20 may be greater than about 1 μm and less than about 50% of the second width W20.

Figure 5C:
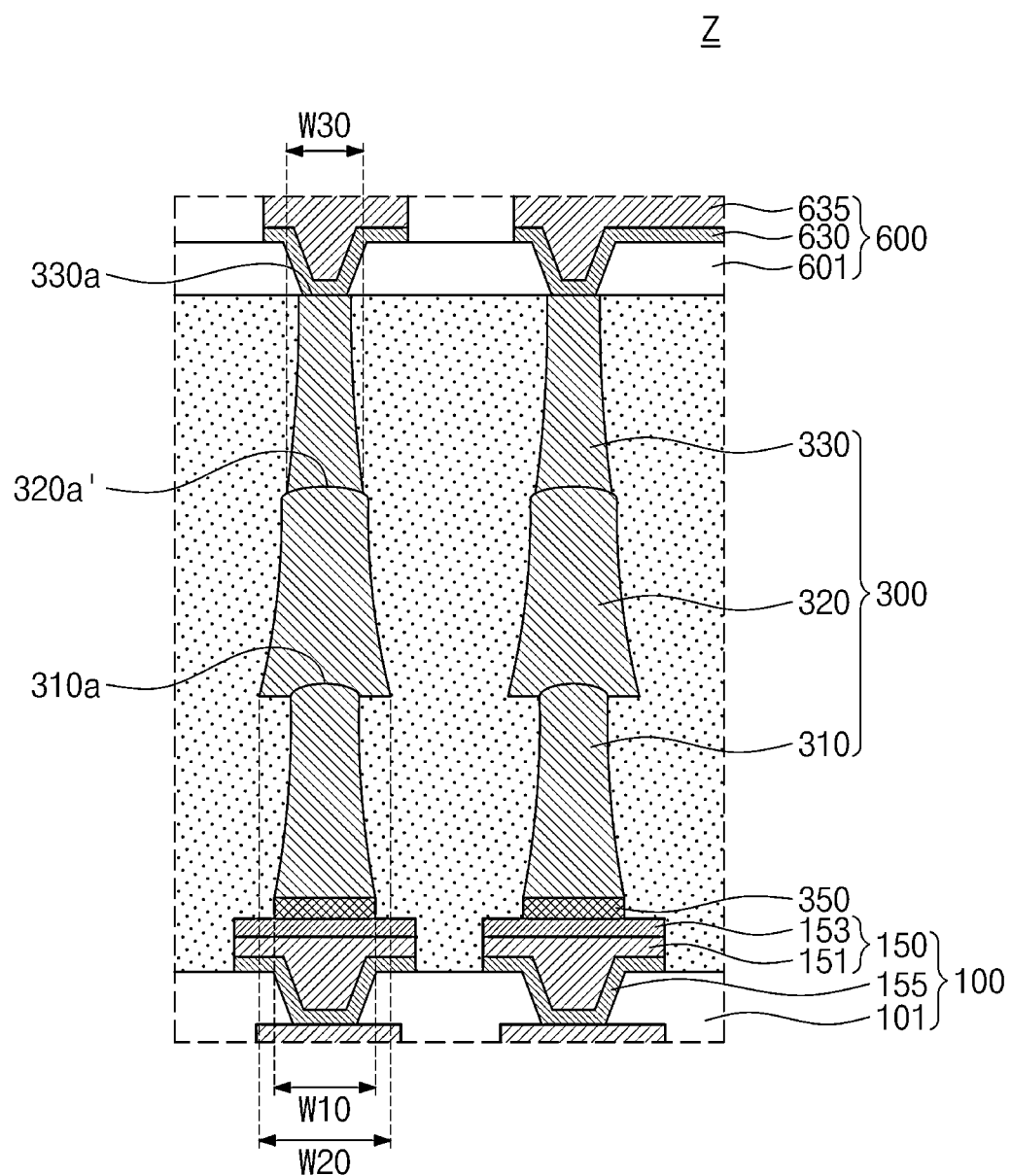
FIG. 5C illustrates a cross-sectional view showing conductive structures according to some embodiments.

FIG. 5C illustrates an enlarged view of section Z depicted in FIG. 1A, showing conductive structures according to some embodiments.

Referring to FIG. 5C, each of the conductive structures 300 may include a first conductive structure 310, a second conductive structure 320, and a third conductive structure 330. The first conductive structure 310, the second conductive structure 320, and the third conductive structure 330 may be substantially similar to those discussed in the example of FIG. 3A except that the first width W10 may be less than the second width W20. For example, the second width W20 may be greater than the third width W30.

Figure 6:
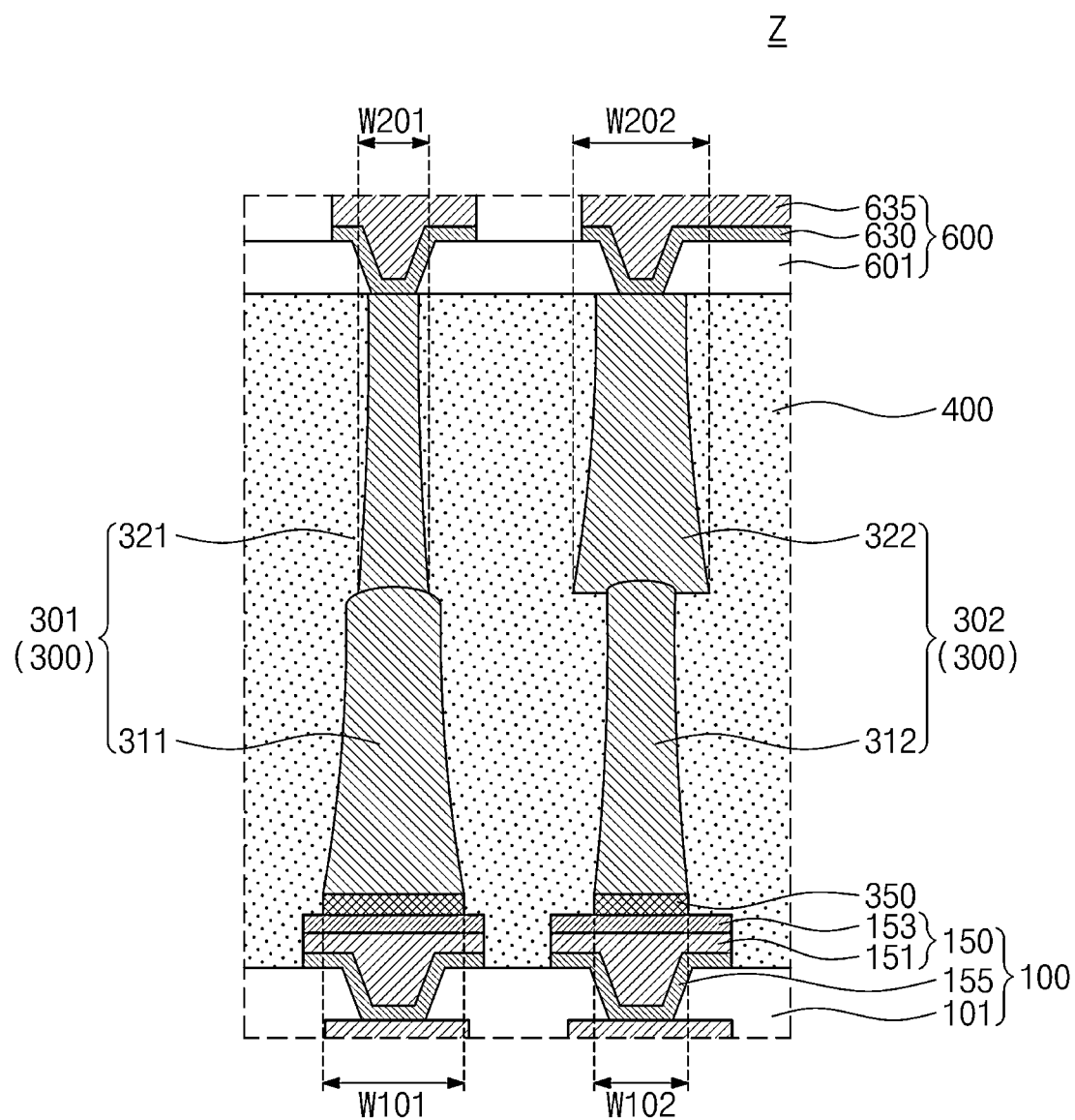
FIG. 6 illustrates a cross-sectional view showing conductive structures according to some embodiments.

FIG. 6 illustrates an enlarged view of section Z depicted in FIG. 1A, showing conductive structures according to some embodiments.

Referring to FIG. 6, the conductive structures 300 may include a first sub-conductive structure 301 and a second sub-conductive structure 302 that are spaced apart from each other. The first sub-conductive structure 301 and the second sub-conductive structure 302 may be adjacent to each other. For example, in some embodiments, neither the semiconductor chip 200 nor other conductive structures 300 may be provided between the first sub-conductive structure 301 and the second sub-conductive structure 302.

The first sub-conductive structure 301 may include a first conductive structure 311 and a second conductive structure 321. The first conductive structure 311 and the second conductive structure 321 of the first sub-conductive structure 301 may be respectively substantially the same as the first conductive structure 310 and the second conductive structure 320 discussed in the example of FIGS. 1A and 1B (and/or FIGS. 1C and/or 4). For example, a first width W101 at a bottom surface of the first conductive structure 311 included in the first sub-conductive structure 301 may be greater than a second width W201 at a bottom surface of the second conductive structure 321 included in the first sub-conductive structure 301.

The second sub-conductive structure 302 may include a first conductive structure 312 and a second conductive structure 322. The first conductive structure 312 and the second conductive structure 322 of the second sub-conductive structure 302 may be respectively substantially the same as the first conductive structure 310 and the second conductive structure 320 discussed in the example of FIG. 5A (and/or 5B). For example, a first width W102 at a bottom surface of the first conductive structure 312 included in the second sub-conductive structure 302 may be less than a second width W202 at a bottom surface of the second conductive structure 322 included in the second sub-conductive structure 302.

As the first and second sub-conductive structures 301 and 302 are provided, the conductive structures 300 may have a reduced pitch. The conductive structures 300 may increase in integration.

Figure 7A:
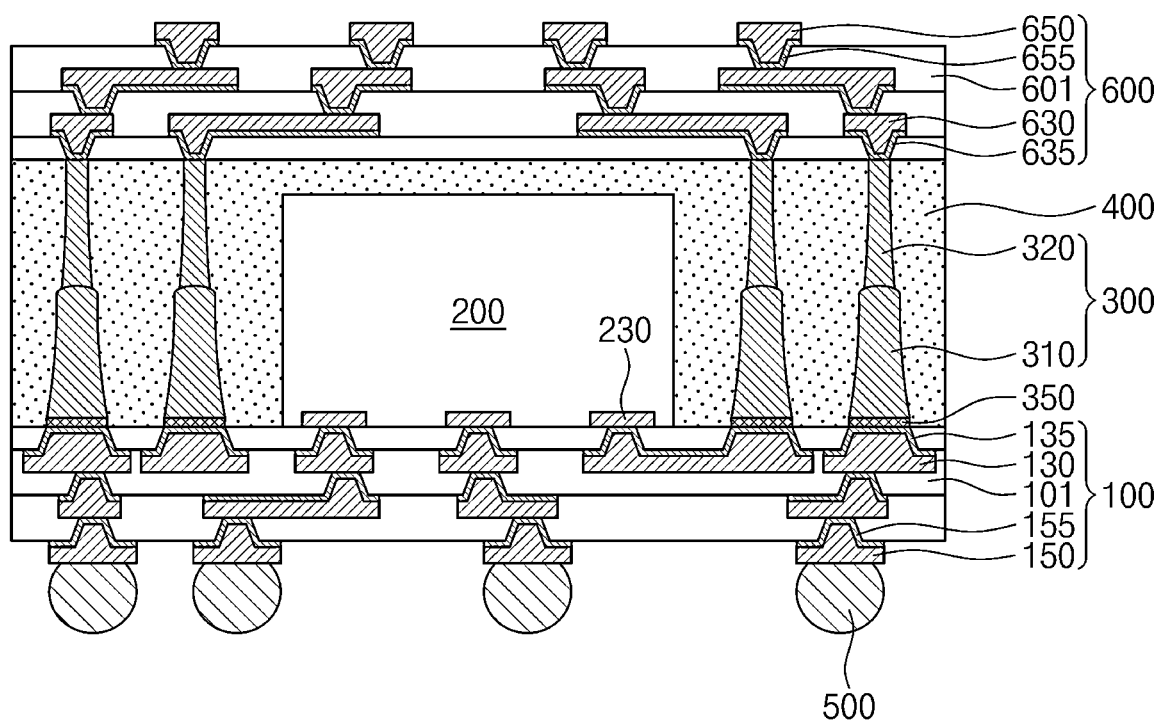
FIG. 7A illustrates a cross-sectional view showing a semiconductor package according to some embodiments.

FIG. 7A illustrates a cross-sectional view showing a semiconductor package according to some embodiments.

Referring to FIG. 7A, a semiconductor package 10A may include a first redistribution substrate 100, solder balls 500, a semiconductor chip 200, conductive structures 300, a molding layer 400, and a second redistribution substrate 600. The semiconductor package 10A may include neither the bumps 250 nor the under-fill layer 410, e.g., as discussed in FIG. 1A.

The first redistribution substrate 100 may include first dielectric layers 101, first redistribution patterns 130, first seed patterns 135, first seed pads 155, and first redistribution pads 150. The first redistribution substrate 100 may be in direct contact with the semiconductor chip 200 and the molding layer 400. For example, an uppermost first dielectric layer 101 may be in direct contact with a bottom surface of the semiconductor chip 200 and with a bottom surface of the molding layer 400. The first seed patterns 135 may be correspondingly provided on top surfaces of the first redistribution patterns 130 and may be coupled to the chip pads 230 of the semiconductor chip 200 or to the conductive seed patterns 350.

For example, the first via part of each of uppermost first redistribution patterns 130 may vertically overlap either one of the conductive seed patterns 350 or one of the chip pads 230 of the semiconductor chip 200. The conductive seed patterns 350 may be interposed between the first seed patterns 135 and the conductive structures 300.

Though not illustrated, the semiconductor package 10A may include at least one of above examples of the conductive structures 300 as discussed, for example, with reference to FIGS. 1B through 6.

The semiconductor package 10A may be fabricated in a chip-first process, but the present inventive concepts are not limited thereto.

Figure 7B:
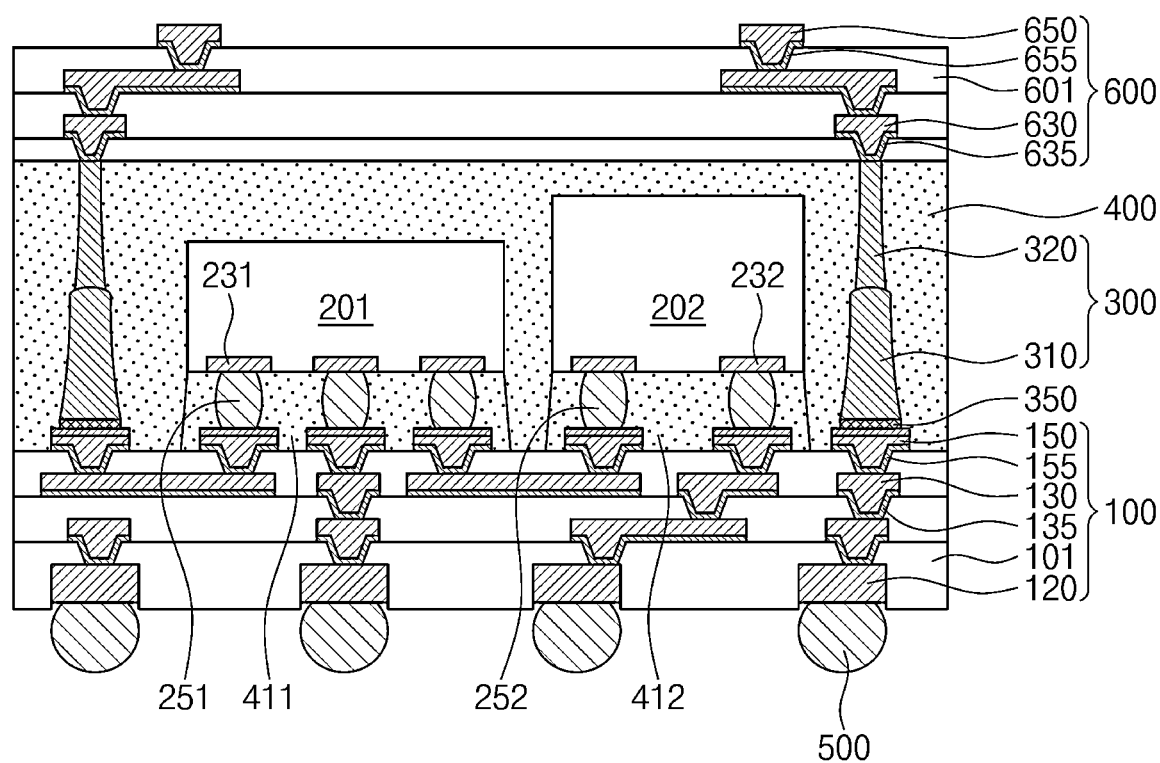
FIG. 7B illustrates a cross-sectional view showing a semiconductor package according to some embodiments.

FIG. 7B illustrates a cross-sectional view showing a semiconductor package according to some embodiments.

Referring to FIG. 7B, a semiconductor package 10B may include a first redistribution substrate 100, solder balls 500, a first semiconductor chip 201, a second semiconductor chip 202, conductive structures 300, a molding layer 400, and a second redistribution substrate 600.

Each of the first and second semiconductor chips 201 and 202 may be substantially the same as the semiconductor chip 200 discussed in FIGS. 1A and 1B. The second semiconductor chip 202 may be disposed laterally spaced apart from the first semiconductor chip 201. The second semiconductor chip 202 may be of a different type from the first semiconductor chip 201. For example, the first semiconductor chip 201 may be a logic chip, and the second semiconductor chip 202 may be a power management chip. The power management chip may include a power management integrated circuit (PMIC). The number of chip pads 232 in the second semiconductor chip 202 may be different from the number of chip pads 231 in the first semiconductor chip 201, but the present inventive concepts are not limited thereto. The second semiconductor chip 202 may have a size different from that of the first semiconductor chip 201, but the present inventive concepts are not limited thereto.

The semiconductor package 10B may further include first bumps 251 and second bumps 252. The first bumps 251 may be interposed between the first redistribution substrate 100 and the first semiconductor chip 201, and may be coupled to corresponding first redistribution pads 150 and to corresponding chip pads 231 of the first semiconductor chip 201. The second bumps 252 may be interposed between the first redistribution substrate 100 and the second semiconductor chip 202, and may be coupled to corresponding first redistribution pads 150 and to corresponding chip pads 232 of the first semiconductor chip 201. The first bumps 251 and the second bumps 252 may include substantially the same material as that discussed in the example of the bumps 250 in FIG. 1A. However, differently from that shown, in some embodiments, the first bumps 251 (and/or a first under-fill layer 411) and/or the second bumps 252 (and/or a second under-fill layer 412) may be omitted, as discussed in the example of FIG. 7A.

The semiconductor package 10B may further include at least one selected from a first under-fill layer 411 and a second under-fill layer 412. The first under-fill layer 411 may be interposed between the first redistribution substrate 100 and the first semiconductor chip 201, thereby encapsulating the first bumps 251. The second under-fill layer 412 may be interposed between the first redistribution substrate 100 and the second semiconductor chip 202, thereby encapsulating the second bumps 252. Each of the first and second under-fill layers 411 and 412 may include the substantially the same material as that discussed in the example of the under-fill layer 410 in FIG. 1A.

Figure 8A:
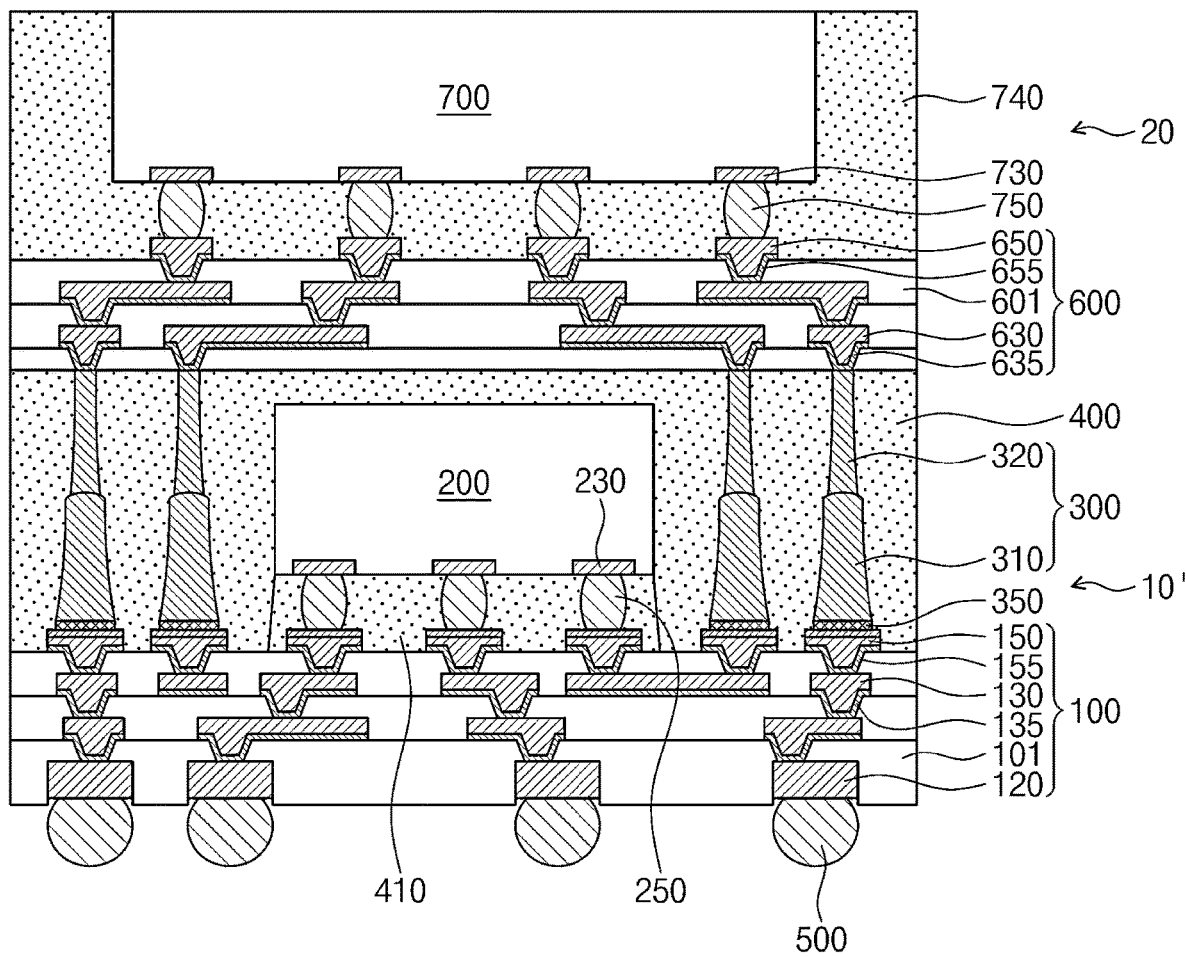
FIG. 8A illustrates a cross-sectional view showing a semiconductor package according to some embodiments.

FIG. 8A illustrates a cross-sectional view showing a semiconductor package according to some embodiments.

Referring to FIG. 8A, a semiconductor package 11 may include a lower package 10' and an upper package 20. The lower package 10' may be substantially the same as the semiconductor package 10 discussed in the example of FIGS. 1A and 1B. The lower package 10' may include a first redistribution substrate 100, solder balls 500, a semiconductor chip 200, a molding layer 400, conductive structures 300, and a second redistribution substrate 600. Alternatively, the lower package 10' may be substantially the same as the semiconductor package 10A of FIG. 7A or the semiconductor package 10B of FIG. 7B.

The upper package 20 may include an upper semiconductor chip 720 and upper bumps 750. The upper semiconductor chip 720 may be of a different type from the semiconductor chip 200. For example, the upper semiconductor chip 720 may be a memory chip, but the present inventive concepts are not limited thereto. The upper semiconductor chip 720 may be mounted on a top surface of the second redistribution substrate 600. For example, the upper bumps 750 may be provided between the second redistribution substrate 600 and the upper semiconductor chip 720. The upper bumps 750 may be coupled to corresponding second redistribution pads 650 and to corresponding chip pads 730 of the upper semiconductor chip 720. The upper bumps 750 may include solder balls. The upper bumps 750 may further include pillar patterns. The upper semiconductor chip 720 may be coupled to the semiconductor chip 200 and/or the solder balls 500 through the second redistribution substrate 600 and the conductive structures 300.

The upper package 20 may further include an upper molding layer 740. The upper molding layer 740 may be provided on the second redistribution substrate 600 and may cover the upper semiconductor chip 720. The upper molding layer 740 may expose a top surface of the upper semiconductor chip 720. Differently from that shown, the upper molding layer 740 may further cover the top surface of the upper semiconductor chip 720. The upper molding layer 740 may include a dielectric polymer, such as an epoxy-based molding compound. Alternatively, the upper molding layer 740 may be omitted.

Figure 8B:
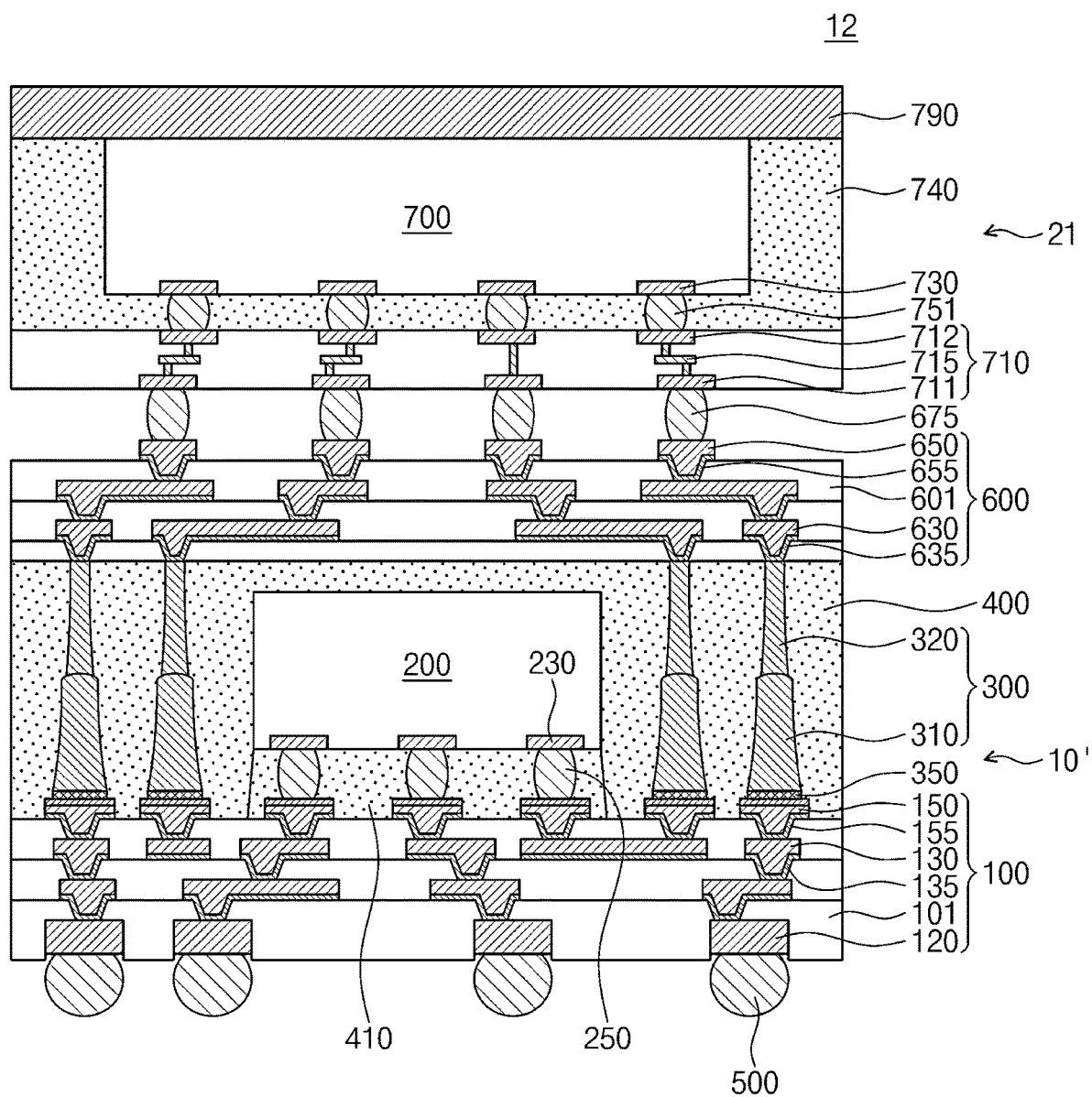
FIG. 8B illustrates a cross-sectional view showing a semiconductor package according to some embodiments.

FIG. 8B illustrates a cross-sectional view showing a semiconductor package according to some embodiments.

Referring to FIG. 8B, a semiconductor package 12 may include a lower package 10', an upper package 21, and connection terminals 675. The lower package 10' may be substantially the same as the semiconductor package 10 discussed in, e.g., the example of FIGS. 1A and 1B and/or the semiconductor package 10' of FIG. 8A. For example, the lower package 10' may be substantially the same as the semiconductor package 10A of FIG. 7A or the semiconductor package 10B of FIG. 7B.

The upper package 21 may include an upper substrate 710, an upper semiconductor chip 720, upper bumps 751, and an upper molding layer 740. The upper substrate 710 may be disposed on and spaced apart from a top surface of the second redistribution substrate 600. The upper substrate 710 may be a printed circuit board (PCB) and/or a redistribution layer. The upper substrate 710 may include first metal pads 711 disposed on a bottom surface thereof, and may also include second metal pads 712 disposed on a top surface thereof. The upper substrate 710 may be provided therein with metal lines 703 coupled to the first metal pads 711 and the second metal pads 712. The upper bumps 751 may be interposed between the upper substrate 710 and the upper semiconductor chip 720, and may be coupled to corresponding first metal pads 711 and to corresponding chip pads 730 of the upper semiconductor chip 720. The upper molding layer 740 may be provided on the upper substrate 710, thereby covering the upper semiconductor chip 720.

The connection terminals 675 may be interposed between the second redistribution substrate 600 and the upper substrate 710, and may be coupled to the second redistribution pads 650 and the first metal pads 711. The connection terminals 675 may include a solder material. The connection terminals 675 may further include pillar patterns, but the present inventive concepts are not limited thereto.

The upper package 20 may further include a thermal radiation structure 790. The thermal radiation structure 790 may be disposed on a top surface of the upper semiconductor chip 720 and a top surface of the upper molding layer 740. The thermal radiation structure 790 may further extend onto a lateral surface of the upper molding layer 740. The thermal radiation structure 790 may include a heat sink, a heat slug, a thermal interface material (TIM) layer, and/or the like. The thermal radiation structure 790 may include, for example, metal.

Some embodiments of the present inventive concepts may be combined with each other. For example, one or more of the semiconductor package 10A of FIG. 7A, the semiconductor package 10B of FIG. 7B, the semiconductor package 11 of FIG. 8A, and the semiconductor package 12 of FIG. 8B may include the conductive structures 300 of FIG. 1C, FIG. 2, FIG. 3A, FIG. 3B, FIG. 4, FIG. 5A, FIG. 5B, FIG. 5C, and/or FIG. 6.

Figure 9A:
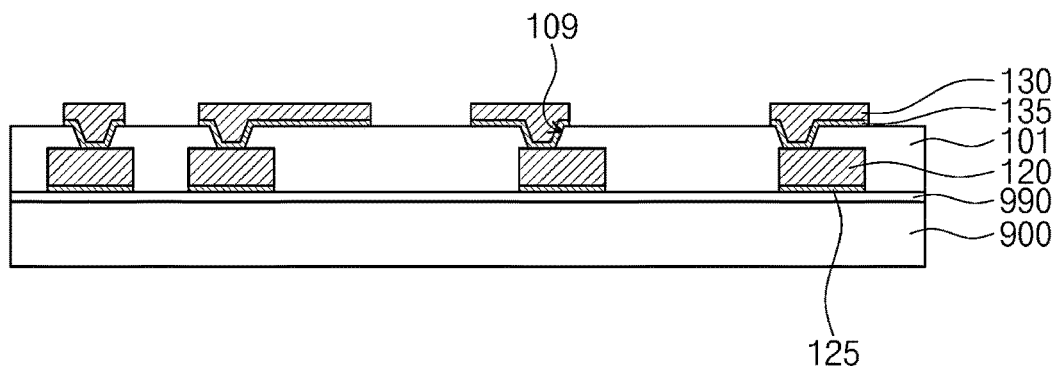
FIGS. 9A to 9P illustrate cross-sectional views showing a method of fabricating a semiconductor package according to some embodiments.
Figure 9B:
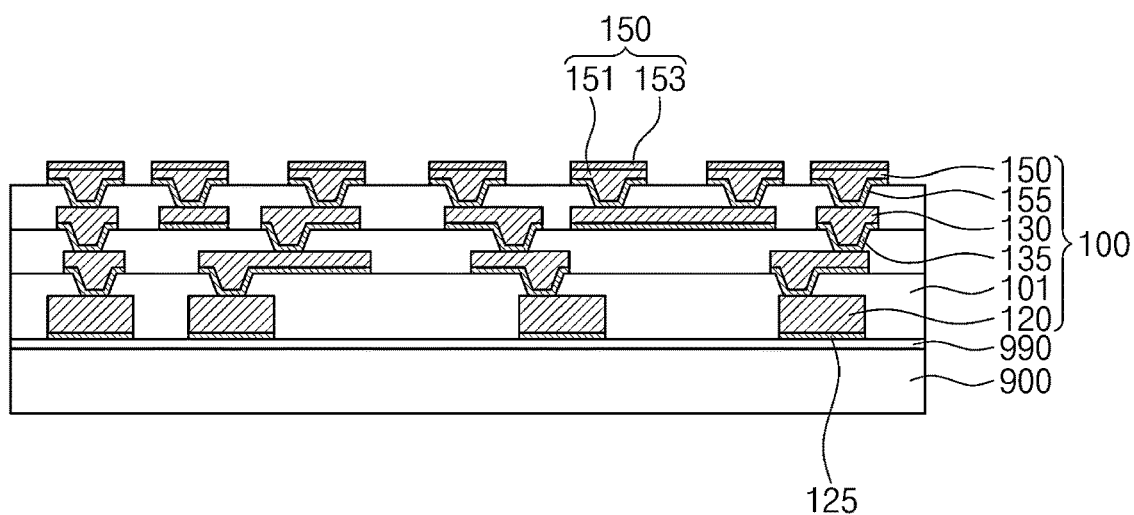
Figure 9C:
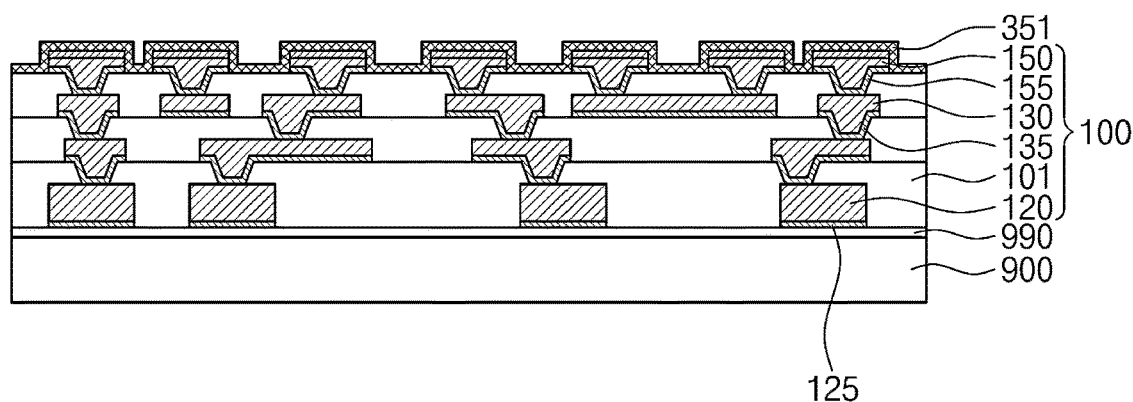
Figure 9D:
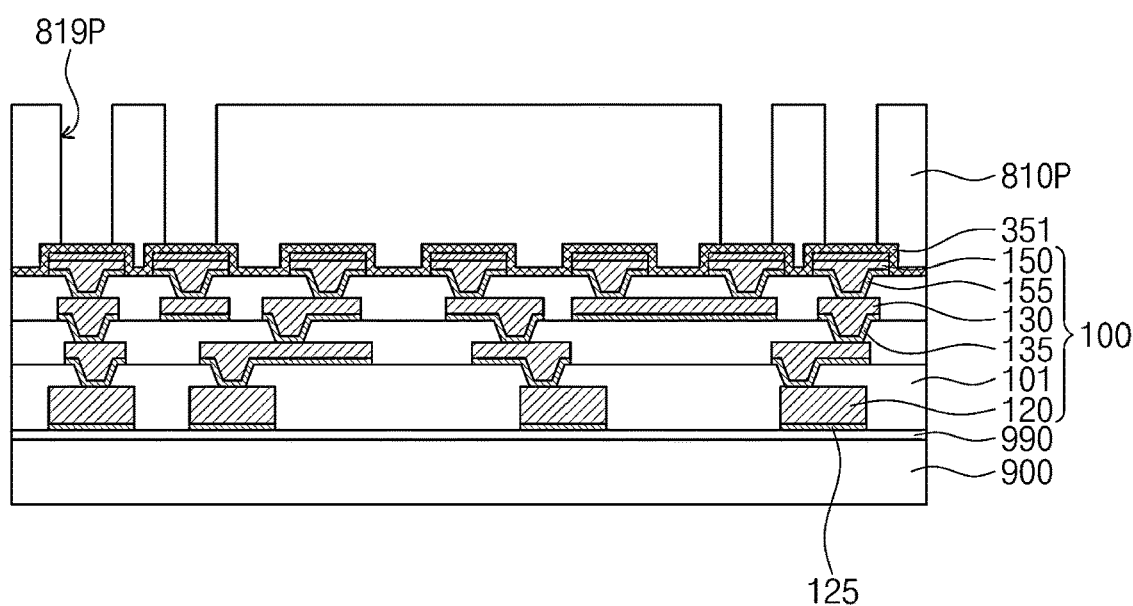
Figure 9E:
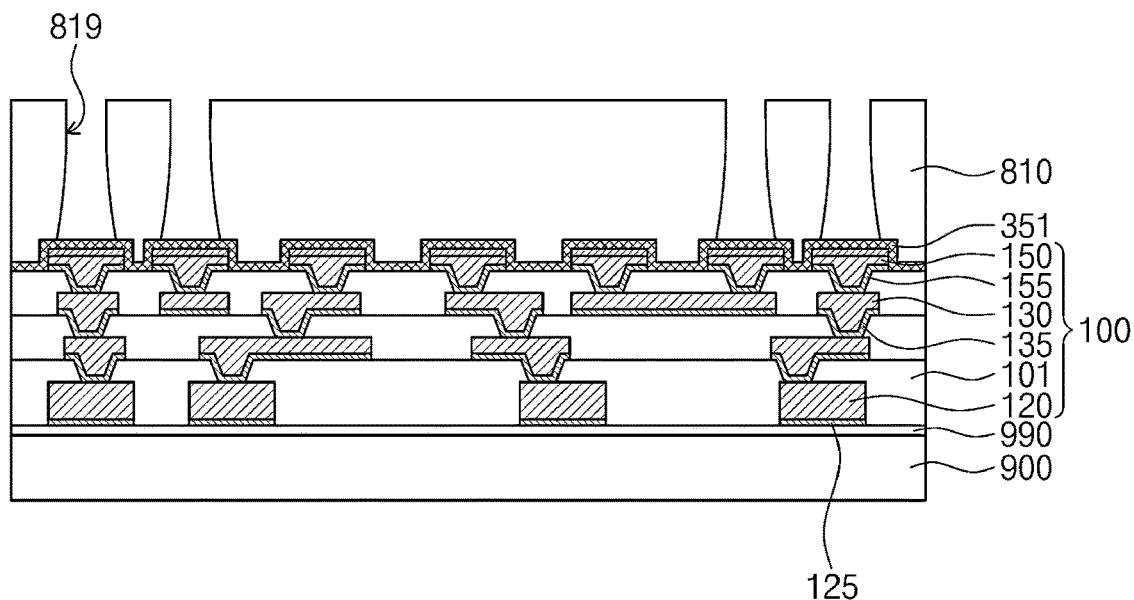
Figure 9F:
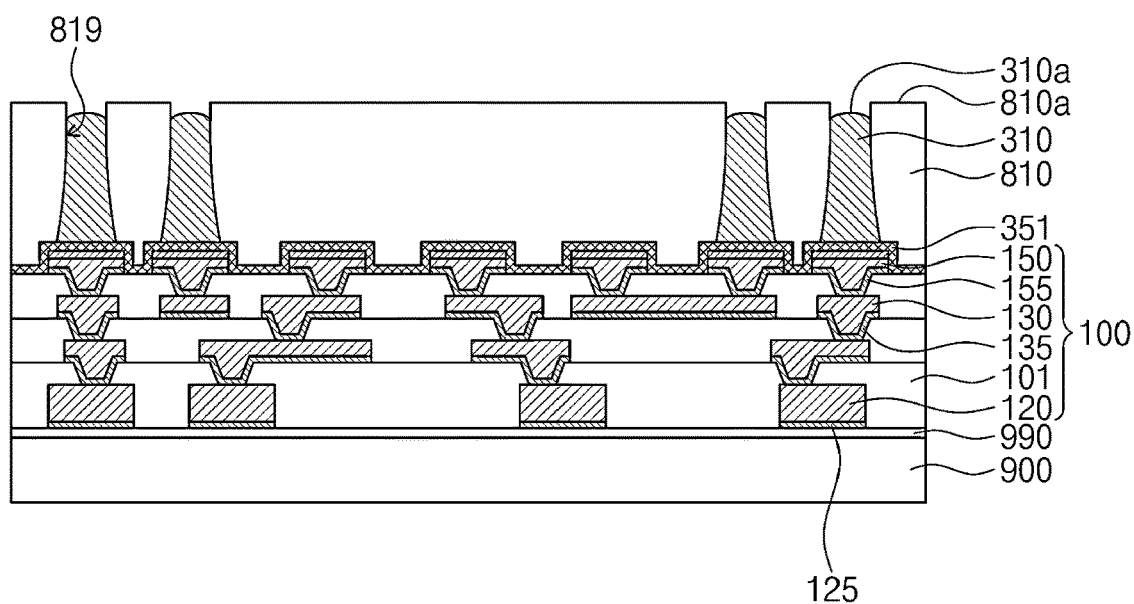
Figure 9G:
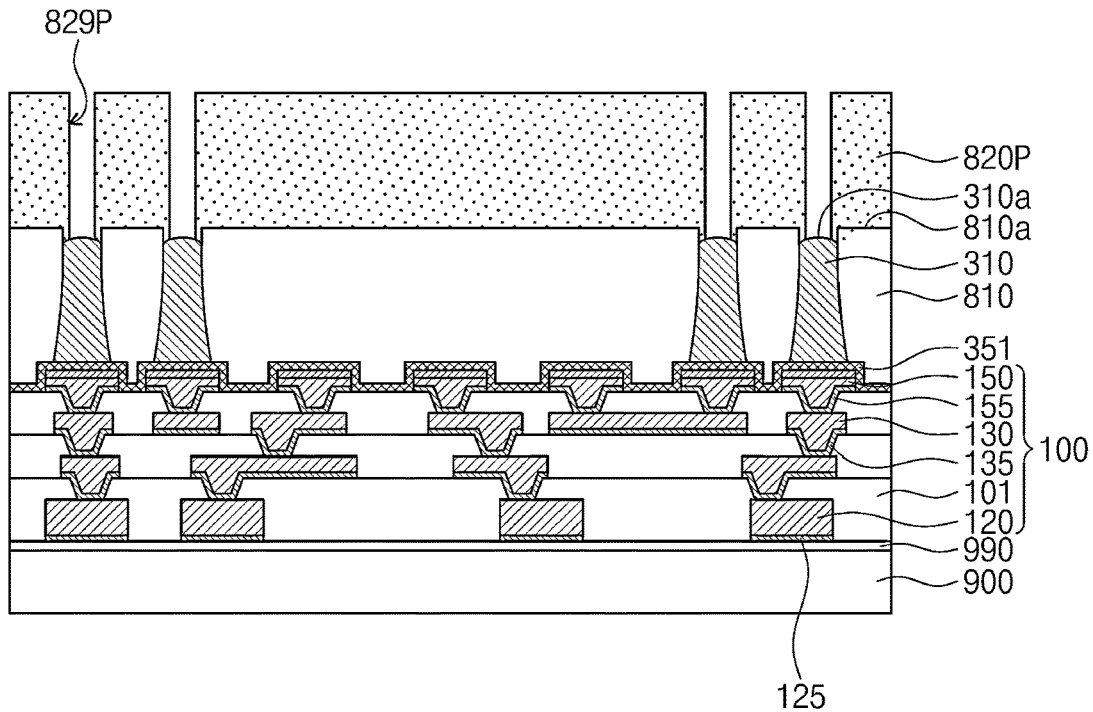
Figure 9H:
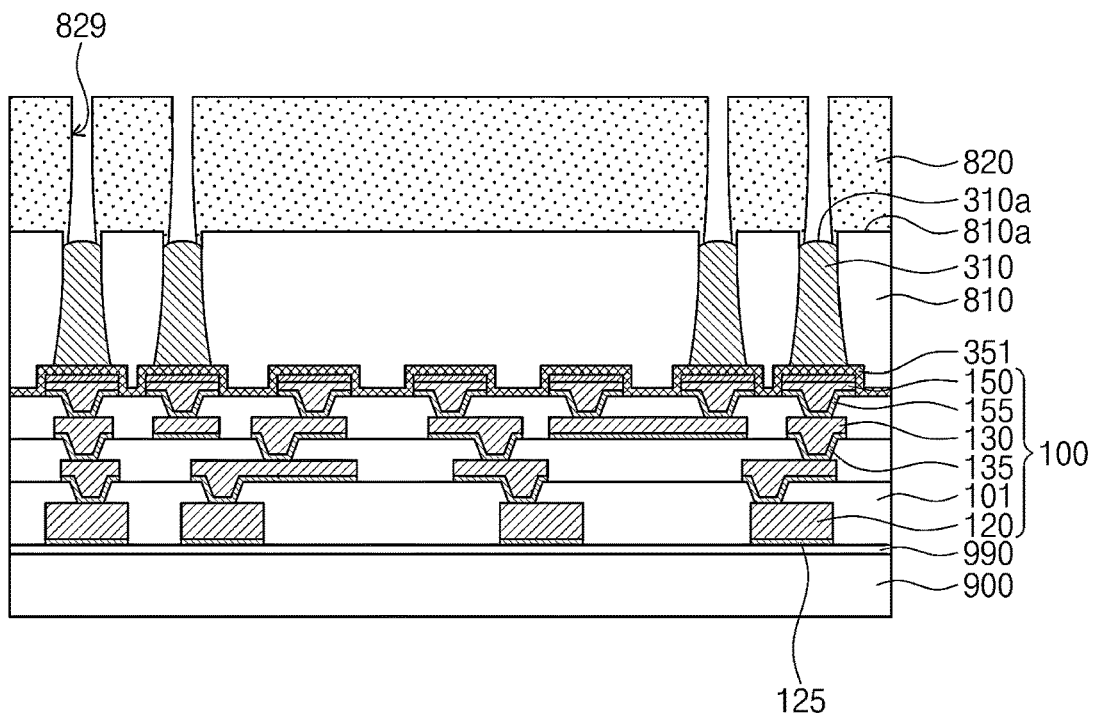
Figure 9I:
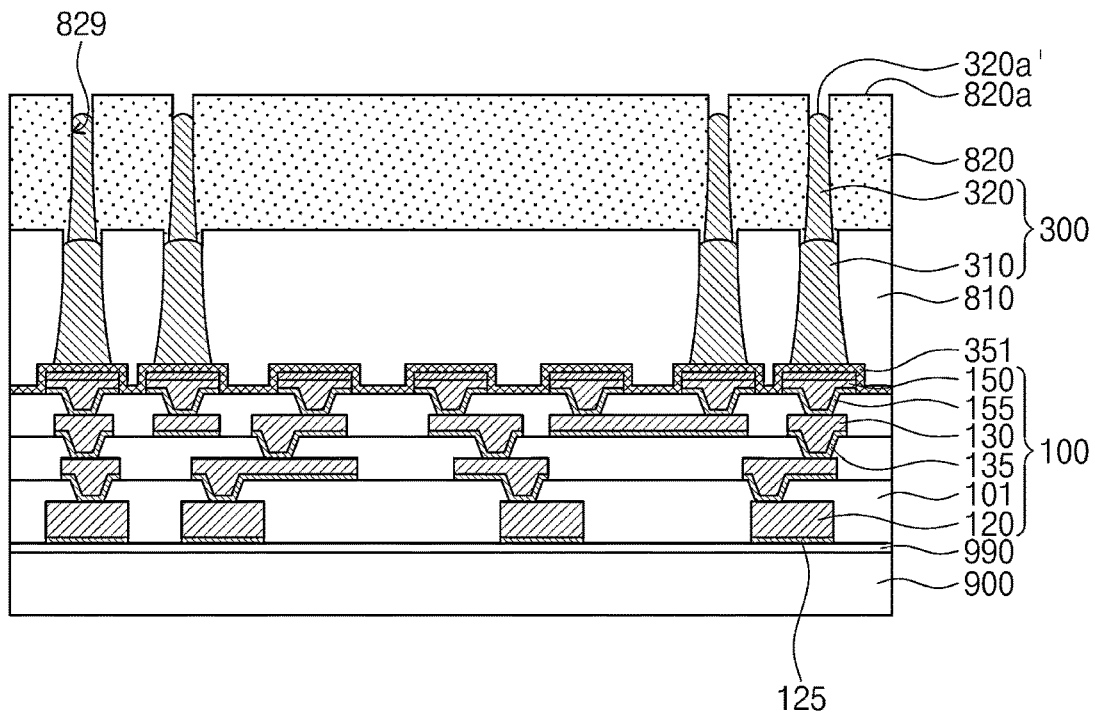
Figure 9J:
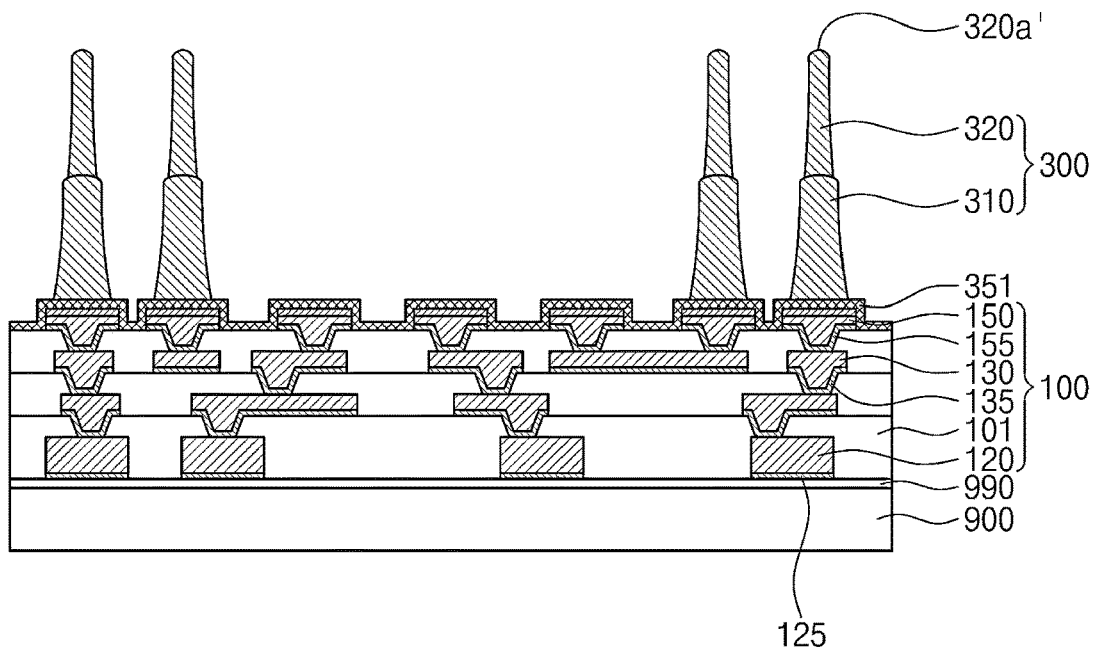
Figure 9K:
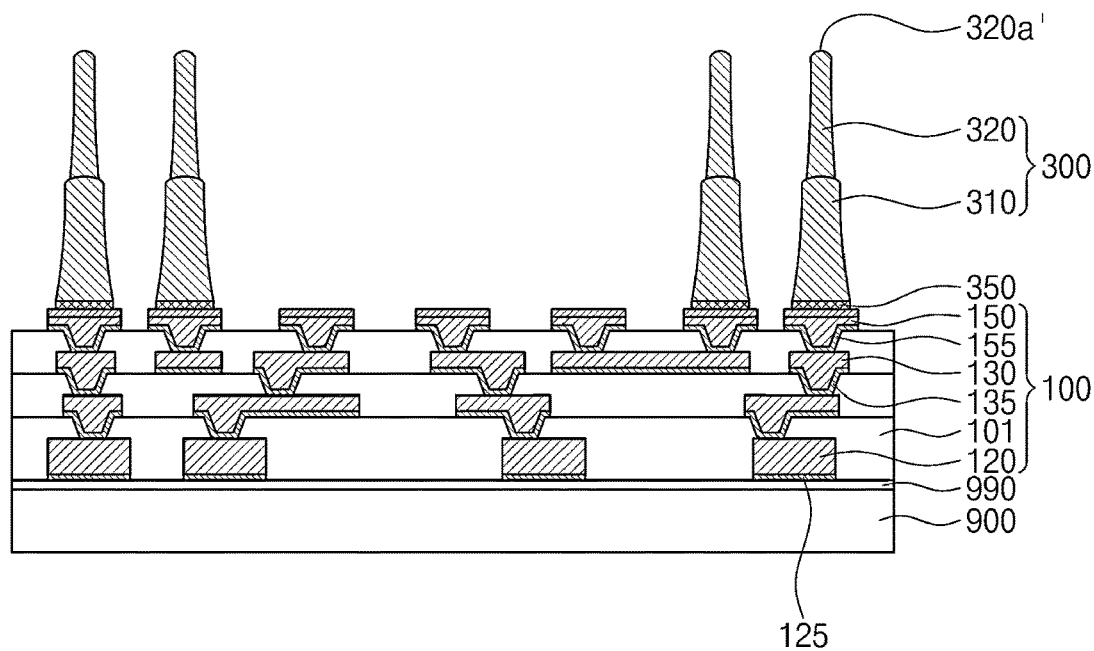
Figure 9L:
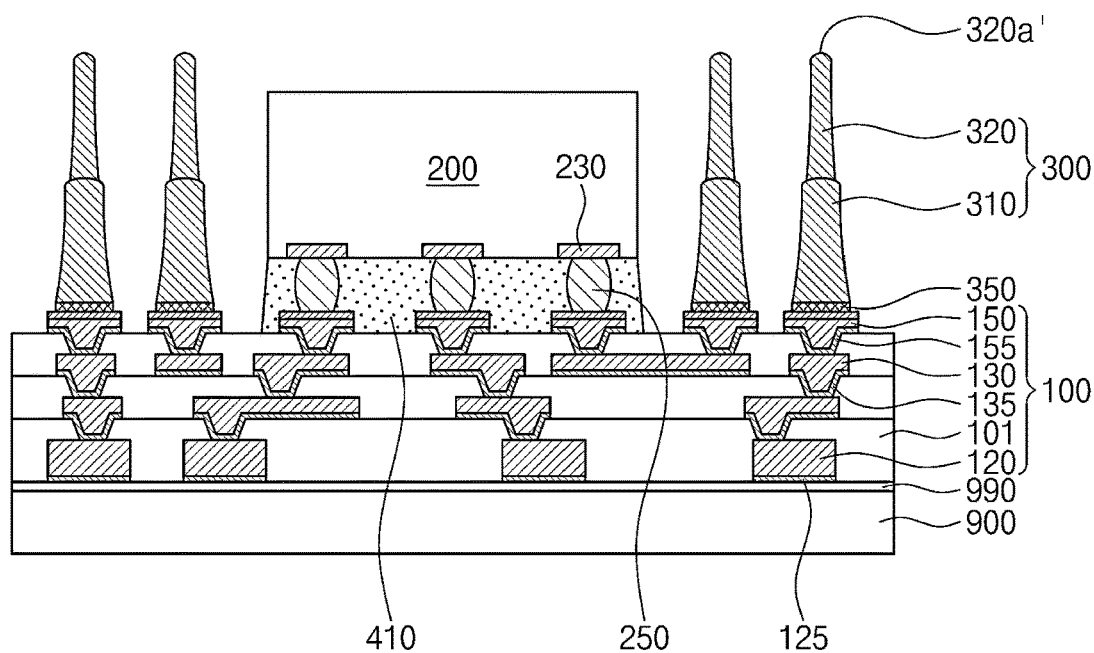
Figure 9M:
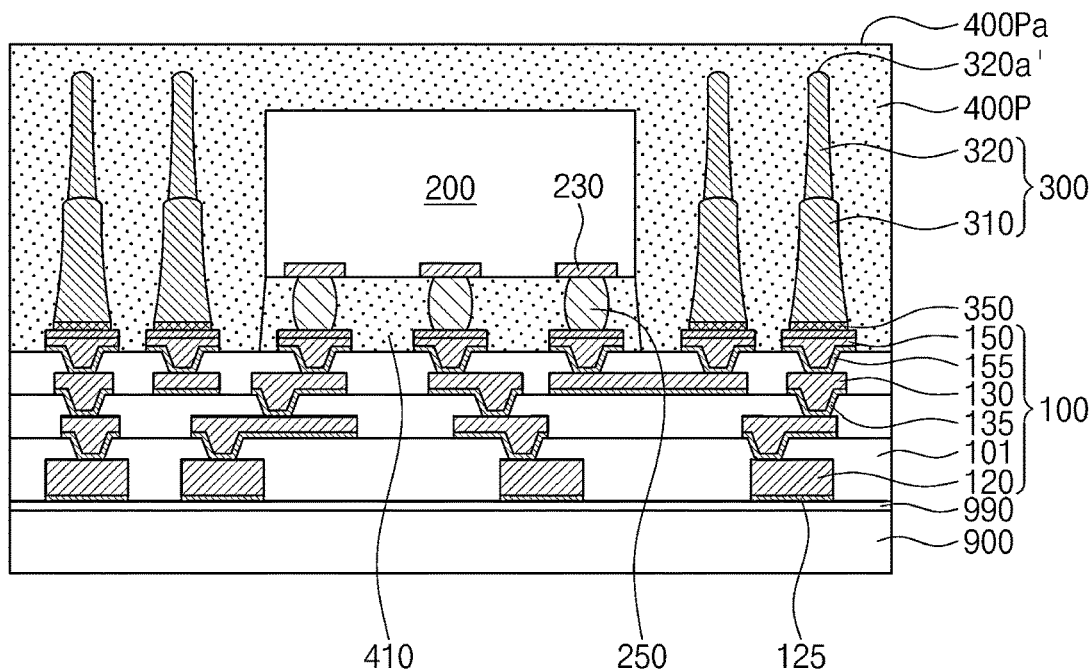
Figure 9N:
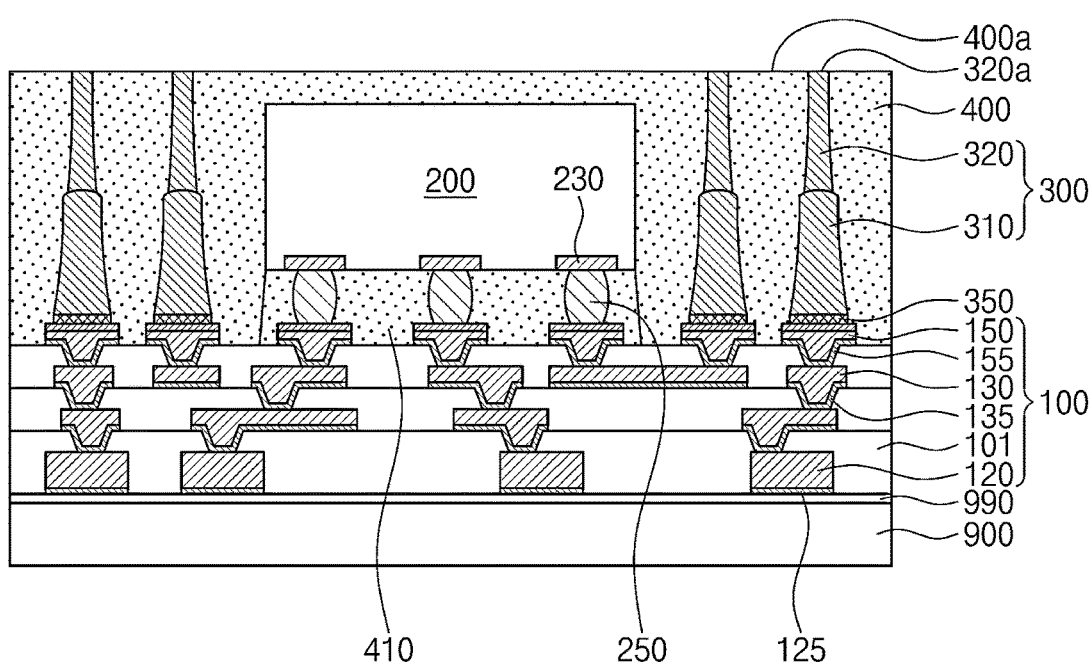
Figure 9O:
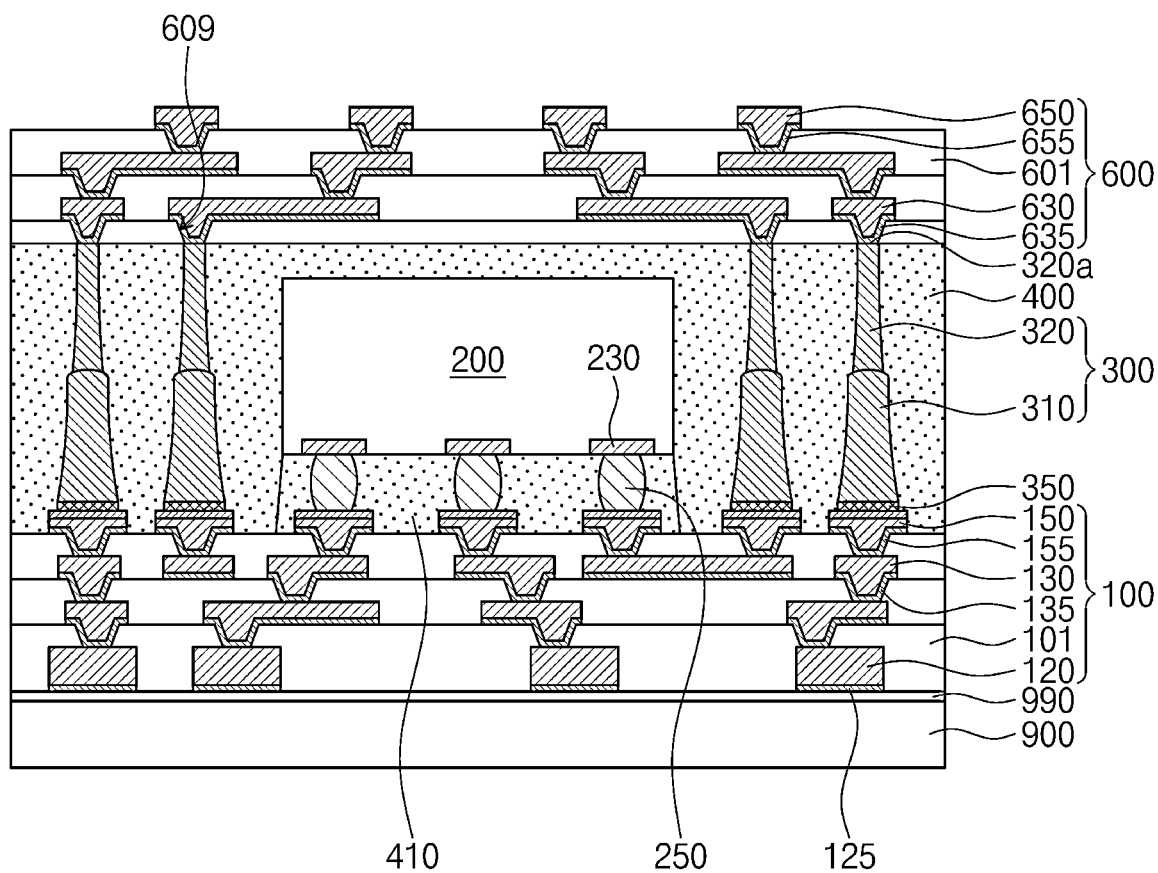
Figure 9P:
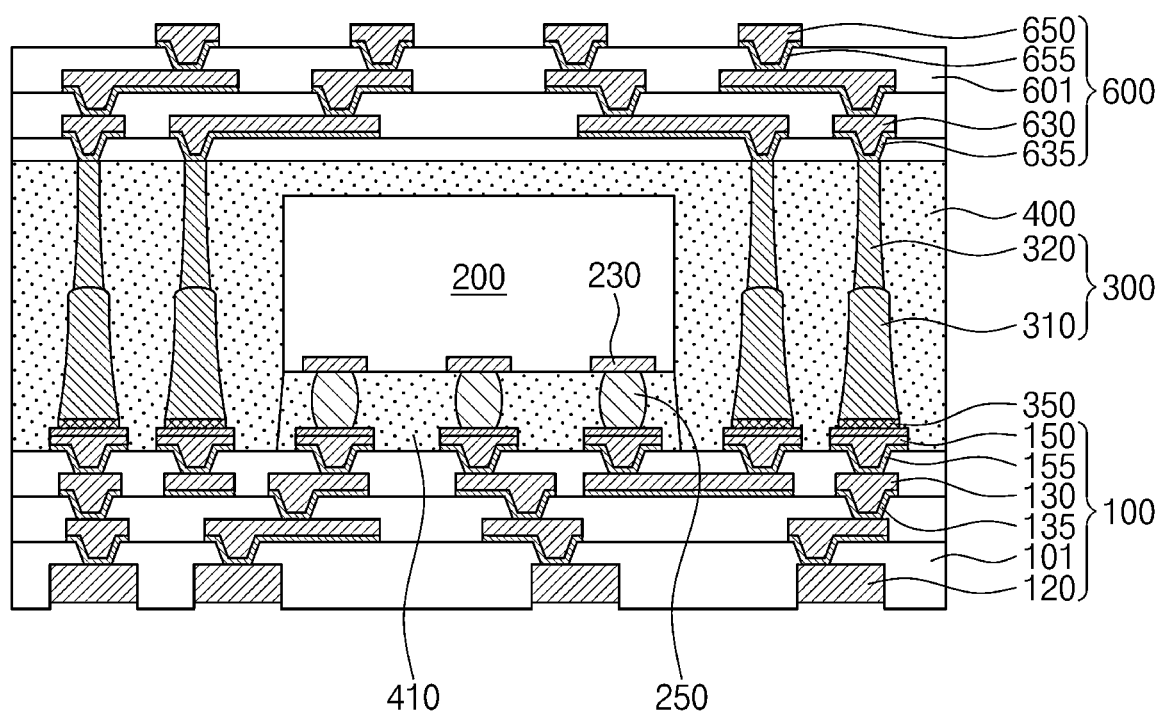

FIGS. 9A to 9P illustrate cross-sectional views showing a method of fabricating a semiconductor package according to some embodiments. Duplicate descriptions will be omitted below.

Referring to FIG. 9A, under-bump seed patterns 125, under-bump patterns 120, a first dielectric layer 101, first seed patterns 135, and first redistribution patterns 130 may be formed on a carrier substrate 900. A carrier adhesion layer 990 may further be formed between the carrier substrate 900 and the first dielectric layer 101 and between the carrier substrate 900 and the under-bump patterns 120. The carrier adhesion layer 990 may attach the first dielectric layer 101 and the under-bump patterns 120 to the carrier substrate 900. The carrier adhesion layer 990 may be a release layer.

According to some embodiments, the under-bump patterns 120 may be formed on corresponding under-bump seed patterns 125. The under-bump patterns 120 may be formed by, e.g., an electroplating process in which the under-bump seed patterns 125 are used. The first dielectric layer 101 may be formed on the carrier adhesion layer 990 and may cover sidewalls and top surfaces of the under-bump patterns 120. First openings 109 may be formed in the first dielectric layer 101 to expose the under-bump patterns 120.

The formation of the first seed patterns 135 and the first redistribution patterns 130 may include forming a first seed layer (not shown) in the first openings 109 and on a top surface of the first dielectric layer 101, forming on the first seed layer a resist pattern (not shown) having guide openings, performing an electroplating process in which the first seed layer is used as an electrode, removing the resist pattern to expose a portion of the first seed layer, and etching the exposed portion of the first seed layer.

The guide openings may be spatially connected to corresponding first openings 109. The electroplating process may form the first redistribution patterns 130 in the first openings 109 and in the guide openings. Each of the first redistribution patterns 130 may include a first via part and a first wire part. The first via part may be formed in corresponding first opening 109, and the first wire part may be formed on the first via part and on the first dielectric layer 101. The etching of the first seed layer may correspondingly form the first seed patterns 135 on bottom surfaces of the first redistribution patterns 130.

Referring to FIG. 9B, the formation of a first dielectric layer 101, the formation of first seed patterns 135, and the formation of first redistribution patterns 130 may be performed repeatedly. Therefore, stacked first dielectric layers 101 may be formed, and stacked first redistribution patterns 130 may be formed.

First redistribution pads 150 may be formed in corresponding openings of an uppermost first dielectric layer 101 and may be coupled to the first redistribution patterns 130. First seed pads 155 may be correspondingly formed on bottom surfaces of the first redistribution pads 150. The formation of the first redistribution pads 150 may include forming conductive pads 151 and forming bonding pads 153. An electroplating process may be performed in which the first seed pads 155 are used as electrodes, thereby forming the conductive pads 151. The bonding pads 153 may be formed on the conductive pads 151. Therefore, a first redistribution substrate 100 may be manufactured. The first redistribution substrate 100 may include the first dielectric layers 101, the under-bump patterns 120, the first seed patterns 135, the first redistribution patterns 130, the first seed pads 155, and the first redistribution pads 150.

Referring to FIG. 9C, a conductive seed layer 351 may be formed on a top surface of the first redistribution substrate 100, thereby covering the first redistribution pads 150 and the uppermost first dielectric layer 101. For example, the conductive seed layer 351 may cover sidewalls and top surfaces of the first redistribution pads 150 and may also cover a top surface of the uppermost first dielectric layer 101.

Referring to FIG. 9D, a first preliminary resist pattern 810P may be formed on a top surface of the conductive seed layer 351. The first preliminary resist pattern 810P may include an organic material (such as a polymer), but the present inventive concepts are not limited thereto. The first preliminary resist pattern 810P may include a negative photoresist material. The first preliminary resist pattern 810P may be patterned by exposure and development processes. First preliminary holes 819P may be formed in the first preliminary resist pattern 810P. The first preliminary holes 819P may expose the conductive seed layer 351. The first preliminary holes 819P may have their uniform width. For example, an upper portion of each of the first preliminary holes 819P may have a width substantially the same as that at a lower portion of each of the first preliminary holes 819P.

Referring successively to FIGS. 9D and 9E, the first preliminary resist pattern 810P may undergo a curing process to form a first resist pattern 810 that has first holes 819. For example, a photo-curing process may be performed to cure the first preliminary resist pattern 810P. As light first reaches an upper portion of the first preliminary resist pattern 810P, the upper portion of the first preliminary resist pattern 810P may be cured earlier than a lower portion of the first preliminary resist pattern 810P. Alternatively, an amount of light irradiated on the upper portion of the first preliminary resist pattern 810P may be greater than an amount of light irradiated on the lower portion of the first preliminary resist pattern 810P. Therefore, the first preliminary holes 819P may be formed into the first holes 819. The first holes 819 may have their shape different from that of the first preliminary holes 819P. For example, a lower portion of each of the first holes 819 may have a width greater than that at an upper portion of each of the first holes 819.

Referring to FIG. 9F, a plurality of first conductive structures 310 may be formed in the first holes 819 and on the conductive seed layer 351. The formation of the first conductive structures 310 may include performing an electroplating process in which the conductive seed layer 351 is used as an electrode. The first conductive structures 310 may have their top surfaces 310a located at a level lower than that a top surface 810a of the first resist pattern 810. The electroplating process may terminate before the first conductive structures 310 extend onto the top surface 810a of the first resist pattern 810. Therefore, no planarization process may be separately required in a process where the first conductive structures 310 are formed. It may be possible to simplify a fabrication process for the first conductive structures 310. The first conductive structures 310 may have a shape that corresponds to the shape of the first holes 819.

Differently from the explanation of FIGS. 9D and 9E, the first preliminary resist pattern 810P may include a positive photoresist material. In this case, each of the first conductive structures 310 may have the same shape as that of the first conductive structure 310 discussed in the example of FIG. 2.

Referring to FIG. 9G, a second preliminary resist pattern 820P may be formed on the first resist pattern 810. The second preliminary resist pattern 820P may include a negative photoresist material. The second preliminary resist pattern 820P may be patterned by exposure and development processes to form second preliminary holes 829P. The second preliminary holes 829P may be provided in the second preliminary resist pattern 820P and may expose the first conductive structures 310. The second preliminary holes 829P may have their uniform width. For example, an upper portion of each of the second preliminary holes 829P may have a width substantially the same as that at a lower portion of each of the second preliminary holes 829P.

Referring successively to FIGS. 9G and 9H, the second preliminary resist pattern 820P may undergo a curing process to form a second resist pattern 820 that has second holes 829. For example, a photo-curing process may be performed to cure the second preliminary resist pattern 820P. As light first reaches an upper portion of the second preliminary resist pattern 820P, the upper portion of the second preliminary resist pattern 820P may be cured earlier than a lower portion of the second preliminary resist pattern 820P. Alternatively, an amount of light irradiated on the upper portion of the second preliminary resist pattern 820P may be greater than an amount of light irradiated on the lower portion of the second preliminary resist pattern 820P. Therefore, the second preliminary holes 829P may be formed into the second holes 829. The second holes 829 may have their shape different from that of the second preliminary holes 829P. For example, a lower portion of each of the second holes 829 may have a width greater than that at an upper portion of each of the second holes 829.

Referring to FIG. 9I, a plurality of second conductive structures 320 may be formed in the second holes 829 and on the first conductive structures 310. The formation of the second conductive structures 320 may include performing an electroplating process in which the first conductive structures 310 are used as electrodes. The second conductive structures 320 may have a grain structure different from those of the first conductive structures 310. The second conductive structures 320 may have their top surfaces 320a' located at a level higher than that of a top surface of the semiconductor chip 200. The top surfaces 320a' of the second conductive structures 320 may be located at a level lower than that of a top surface 820a of the second resist pattern 820. The electroplating process may terminate before the second conductive structures 320 extend onto the top surface 820a of the second resist pattern 820. Therefore, no planarization process may be separately required in a process where the second conductive structures 320 are formed. It may be possible to simplify a fabrication process for the second conductive structures 320. The second conductive structures 320 may have a shape that corresponds to that of the second holes 829.

Differently from the explanation of FIGS. 9G and 9H, the second preliminary resist pattern 820P may include a positive photoresist material. In this case, the second conductive structures 320 may have the same shape as that of the second conductive structures 320 discussed in the example of FIG. 2.

Referring to FIG. 9J, the second resist pattern 820 and the first resist pattern 810 may be removed to expose the conductive seed layer 351. A strip process may be performed to remove the second resist pattern 820 and the first resist pattern 810. The first resist pattern 810 and the second resist pattern 820 may be removed by a single process and/or separate processes.

Referring successively to FIGS. 9J and 9K, the conductive seed layer 351 may be patterned to form conductive seed patterns 350. An etching process may be performed to pattern the conductive seed layer 351. The etching process may remove a first part of the conductive seed layer 351 to expose the first redistribution substrate 100. For example, the uppermost first dielectric layer 101 may be exposed, and the first redistribution pads 150 may also be exposed.

In the etching process, the conductive structures 300 may have an etch selectivity with respect to the conductive seed layer 351. Second parts of the conductive seed layer 351 may be provided on bottom surfaces of the conductive structures 300. The second parts of the conductive seed layer 351 may not be exposed to the etching process. After termination of the etching process, the second parts of the conductive seed layer 351 may be formed into conductive seed patterns 350. The conductive seed patterns 350 may be spaced apart and electrically separated from each other.

Referring to FIG. 9L, a semiconductor chip 200 may be mounted on a top surface of the first redistribution substrate 100. The mounting of the semiconductor chip 200 may include forming bumps 250 between the first redistribution substrate 100 and the semiconductor chip 200. The bumps 250 may be coupled to the first redistribution pads 150 and to chip pads 230 of the semiconductor chip 200. An underfill layer 410 may further be formed between the first redistribution substrate 100 and the semiconductor chip 200.

Referring to FIG. 9M, a preliminary molding layer 400P may be formed on the top surface of the first redistribution substrate 100 to cover the semiconductor chip 200 and the conductive structures 300. For example, the preliminary molding layer 400P may have a top surface 400Pa located at a level higher than that of the top surface of the semiconductor chip 200 and that of the top surfaces 320a' of the conductive structures 300.

Referring to FIG. 9N, the preliminary molding layer 400P may undergo a planarization (e.g., a grinding) process to form a molding layer 400. For example, the planarization process may include a chemical and/or mechanical polishing process. After the exposure of the top surfaces 320a' of the second conductive structures 320, the grinding process may further be performed on the top surfaces 320a' of the second conductive structures 320. The second conductive structures 320 may further be partially removed. As a result, the second conductive structures 320 may be flat on their ground top surfaces 320a. The molding layer 400 may have a top surface 400a coplanar with the ground top surfaces 320a of the conductive structures 300. The grinding process may terminate before the top surface of the semiconductor chip 200 is exposed. The top surface 400a of the molding layer 400 may be located at a level higher than that of the top surface of the semiconductor chip 200 and may cover the top surface of the semiconductor chip 200.

Referring to FIG. 9O, a second redistribution substrate 600 may be formed on the molding layer 400 and the conductive structures 300. According to some embodiments, a second dielectric layer 601 may be formed on the top surface (see 400a of FIG. 9N) of the molding layer 400. Second openings 609 may be formed in the second dielectric layer 601 to correspondingly expose the top surfaces 320a of the second conductive structures 320. Second seed patterns 635 may be formed in the second openings 609 and on a top surface of the second dielectric layer 601. Second redistribution patterns 630 may be formed in the second openings 609 and on the top surface of the second dielectric layer 601, thereby covering the second seed patterns 635.

Each of the second redistribution patterns 630 may include a second via part and a second wire part. The second via part may be formed in a corresponding second opening 609. The second wire part may be formed on the second via part and may extend onto the top surface of the second dielectric layer 601. The formation of the second redistribution substrate 600 may be substantially identical and/or similar to the formation of the first redistribution substrate 100 discussed in FIGS. 9A and 9B. For example, the second seed patterns 635 may be substantially identical and/or similar to the formation of the first seed patterns 135 discussed in FIG. 9A, and/or the formation of the second redistribution patterns 630 may be identical or similar to the formation of the first redistribution patterns 130 discussed in FIG. 9A. The formation of the second dielectric layer 601, the formation of the second seed patterns 635, and the formation of the second redistribution patterns 630 may be performed repeatedly. Accordingly, there may be formed a plurality of stacked second dielectric layers 601, a plurality of second seed patterns 635, and a plurality of stacked second redistribution patterns 630.

Second redistribution pads 650 may be formed in an uppermost second dielectric layer 601 and on a top surface of the uppermost second dielectric layer 601. Before the second redistribution pads 650 are formed, second seed pads 655 may be formed. The second redistribution pads 650 may be formed by an electroplating process in which the second seed pads 655 are used as electrodes. Therefore, a second redistribution substrate 600 may be manufactured. The second redistribution substrate 600 may include the second dielectric layers 601, the second seed patterns 635, the second redistribution patterns 630, the second seed pads 655, and the second redistribution pads 650.

Referring to FIG. 9P, the carrier substrate 900 and the carrier adhesion layer 990 may be removed to expose a bottom surface of the first redistribution substrate 100. For example, there may be exposed a bottom surface of a lowermost first dielectric layer 101 and bottom surfaces of the under-bump seed patterns 125. The exposed under-bump seed patterns 125 may be removed to expose bottom surfaces of the under-bump patterns 120. For example, an etching process may be performed to remove the under-bump seed patterns 125.

Referring back to FIG. 1B, solder balls 500 may be correspondingly formed on the bottom surfaces of the under-bump patterns 120, thereby being coupled to the under-bump patterns 120. Through the processes discussed above, a semiconductor package 10 may be eventually fabricated.

Each of conductive structures may include a first conductive structure and a second conductive structure on first conductive structure. The conductive structures may be arranged at fine pitches with high integration. It may be possible to reduce limitation on height and aspect ratio of the conductive structures and to more freely control an interval between a first redistribution substrate and a second redistribution substrate. Accordingly, the first redistribution substrate may be provided thereon with a semiconductor chip whose thickness is relatively large. A semiconductor package may exhibit increased thermal properties and improved mechanical characteristics.

This detailed description of the present inventive concepts should not be construed as limited to the embodiments set forth herein, and it is intended that the present inventive concepts cover the various combinations, the modifications, and variations of this invention without departing from the spirit and scope of the present inventive concepts.

What is claimed is:

1. A semiconductor package, comprising:
a first redistribution substrate including a stack of dielectric layers, a first redistribution pattern in the stack of dielectric layers, and at least one first redistribution pad electrically connected to the first redistribution pattern, wherein at least a portion of the at least one first redistribution pad is in a hole defined by an uppermost dielectric layer of the stack of dielectric layers;
a solder ball on a bottom surface of the first redistribution substrate;
a second redistribution substrate;
a semiconductor chip between a top surface of the first redistribution substrate and a bottom surface of the second redistribution substrate;
a conductive structure electrically connecting the first redistribution substrate and the second redistribution substrate, the conductive structure laterally spaced apart from the semiconductor chip and including a first conductive structure and a second conductive structure in direct contact with a top surface of the first conductive structure;

a conductive seed pattern between a corresponding one of the least one first redistribution pad and the first conductive structure; and a molding layer between the first redistribution substrate and the second redistribution substrate, wherein a material of the first conductive structure and a material of the second conductive structure is different from a material of the solder ball, the solder ball comprises at least one of tin, bismuth, lead, and silver, and the first conductive structure and the second conductive structure comprise copper, wherein the first conductive structure includes a pillar and the second conductive structure includes a pillar, wherein a connection of the first conductive structure and the second conductive structure comprises copper, and wherein the molding layer directly contacts the at least one first redistribution pad and the conductive seed pattern.

2. The semiconductor package of claim 1, wherein the top surface of the first conductive structure has a dome-shaped cross-section.

3. The semiconductor package of claim 1, wherein
the top surface of the first conductive structure includes a central region and an edge region, and
the central region is at a higher level than the edge region.

4. The semiconductor package of claim 1, wherein
the material of the second conductive structure is a same material as the material of the first conductive structure, and
the second conductive structure has a different grain structure than the first conductive structure.

5. The semiconductor package of claim 1, wherein
a bottom surface of the first conductive structure has a first width,
a bottom surface of the second conductive structure has a second width, and
the second width is less than the first width.

6. The semiconductor package of claim 1, wherein
a bottom surface of the first conductive structure has a first width,
a bottom surface of the second conductive structure has a second width, and
a difference between the first width and the second width is less than or equal to 50% of the second width.

7. The semiconductor package of claim 1, wherein
a first width, at a bottom surface of the first conductive structure, is greater than a width at the top surface of the first conductive structure, and
a second width, at a bottom surface of the second conductive structure, is greater than a width at a top surface of the second conductive structure.

8. The semiconductor package of claim 1, wherein
a first width, at a bottom surface of the first conductive structure, is less than a width at the top surface of the first conductive structure, and
a second width, at a bottom surface of the second conductive structure, is less than a width at a top surface of the second conductive structure.

9. The semiconductor package of claim 1, wherein
a first height of the first conductive structure is 50% to 300% of a first width at a bottom surface of the first conductive structure, and a second height of the second conductive structure is 50% to 300% of a second width at a bottom surface of the second conductive structure.

10. The semiconductor package of claim 1, wherein
the molding layer covers at least a sidewall of the semiconductor chip and a sidewall of the conductive structure, and
wherein the molding layer is in direct contact with a bottom surface of the second redistribution substrate.

11. A semiconductor package, comprising:
a first redistribution substrate including a stack of dielectric layers, a first redistribution pattern in the stack of dielectric layers, and at least one first redistribution pad electrically connected to the first redistribution pattern, wherein at least a portion of the at least one first redistribution pad is in a hole defined by an uppermost dielectric layer of the stack of dielectric layers;

a solder ball on a bottom surface of the first redistribution substrate;

a second redistribution substrate;

a semiconductor chip between a top surface of the first redistribution substrate and a bottom surface the second redistribution substrate;

a conductive structure electrically connecting the first redistribution substrate and the second redistribution substrate, and the conductive structure laterally spaced apart from the semiconductor chip and including a first conductive structure and a second conductive structure in direct contact with a top surface of the first conductive structure;

a conductive seed pattern between a corresponding one of the least one first redistribution pad and the conductive structure; and a molding layer between the first redistribution substrate and the second redistribution substrate, wherein the top surface of the first conductive structure includes a central region and an edge region, and the central region is at a higher level higher than the edge region, wherein a material of the first conductive structure and a material of the second conductive structure is different from a material of the solder ball, the solder ball comprises at least one of tin, bismuth, lead, and silver, and the first conductive structure and the second conductive structure comprise copper, wherein the first conductive structure includes a pillar and the second conductive structure includes a pillar, wherein a connection of the first conductive structure and the second conductive structure comprises copper, and wherein the molding layer directly contacts the at least one first redistribution pad and the conductive seed pattern.

12. The semiconductor package of claim 11, wherein
the second conductive structure includes a same material as the first conductive structure, and
the second conductive structure has a different grain structure than that of the first conductive structure.

13. The semiconductor package of claim 11, wherein
a first width, at a lower portion of the first conductive structure, is different from a width at an upper portion of the first conductive structure, and
a second width, at a lower portion of the second conductive structure, is different from a width at an upper portion of the second conductive structure.

14. The semiconductor package of claim 11, further comprising:

a third conductive structure directly on a top surface of the second conductive structure, wherein the top surface of the second conductive structure includes a second central region and a second edge region, and the second central region is at a higher level than the second edge region.

15. The semiconductor package of claim 11, further comprising:

an upper semiconductor chip on a top surface of the second redistribution substrate.

16. A semiconductor package, comprising:

a first redistribution substrate, the first redistribution substrate including a first dielectric layer and a first redistribution pad at least partially in a first hole defined by a top surface of the first redistribution substrate, the redistribution pad including a first seed pattern, and a first conductive pattern on the first seed pattern, the first dielectric layer including a first photoimageable polymer;

a solder ball on a bottom surface of the first redistribution substrate;

a second redistribution substrate, the second redistribution substrate including a second dielectric layer, a second seed pattern, and a second conductive pattern on the second seed pattern, the second dielectric layer including a second photoimageable polymer;

a semiconductor chip between the top surface of the first redistribution substrate and a bottom surface the second redistribution substrate;

a conductive structure electrically connecting the first redistribution substrate and the second redistribution substrate, the conductive structure laterally spaced apart from the semiconductor chip and including a first conductive structure and a second conductive structure in direct contact with a top surface of the first conductive structure;

a conductive seed pattern between the first redistribution pad and the conductive structure; and a molding layer between the first redistribution substrate and the second redistribution substrate, the molding layer covering at least a sidewall of the semiconductor chip, a sidewall of the conductive seed pattern, and a sidewall of the conductive structure, and exposing a top surface of the conductive structure, wherein the bottom surface of the second redistribution substrate is in physical contact with the molding layer, wherein a material of the first conductive structure and a material of the second conductive structure is different from a material of the solder ball, the solder ball comprises at least one of tin, bismuth, lead, and silver, and the first conductive structure and the second conductive structure comprise copper, wherein the first conductive structure includes a pillar and the second conductive structure includes a pillar, wherein a connection of the first conductive structure and the second conductive structure comprises copper, and wherein the molding layer directly contacts the first redistribution pad and the conductive seed pattern.

17. The semiconductor package of claim 16, wherein the material of the second conductive structure is a same as the material of the first conductive structure, and the second conductive structure has a different grain structure than the first conductive structure.

18. The semiconductor package of claim 16, wherein a bottom surface of the first conductive structure has a first width, a bottom surface of the second conductive structure has a second width, the first width is greater than a width at the top surface of the first conductive structure, the second width is greater than a width at a top surface of the second conductive structure, and the second width is less than the first width.

19. The semiconductor package of claim 16, wherein a bottom surface of the first conductive structure has a first width, a bottom surface of the second conductive structure has a second width, a difference between the first width and the second width is equal to or greater than 1 µm, the difference between the first width and the second width is equal to or less than 50% of the second width, a first height of the first conductive structure is 50% to 300% of the first width, and a second height of the second conductive structure is 50% to 300% of the second width.

20. The semiconductor package of claim 16, wherein the top surface of the first conductive structure is upwardly convex.

* * * * *